US012666803B2

(12) United States Patent
Bae et al.

(10) Patent No.: US 12,666,803 B2
(45) Date of Patent: Jun. 23, 2026

(54) DISPLAY DEVICE AND METHOD OF MANUFACTURING DISPLAY DEVICE

(71) Applicant: Samsung Display Co., Ltd., Yongin-Si (KR)

(72) Inventors: Subin Bae, Yongin-si (KR); Dawoon Jung, Yongin-si (KR); Taewook Kang, Yongin-si (KR); Yunjong Yeo, Yongin-si (KR); Yugwang Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 330 days.

(21) Appl. No.: 18/239,125

(22) Filed: Aug. 29, 2023

(65) Prior Publication Data

US 2024/0155874 A1     May 9, 2024

(30) Foreign Application Priority Data

Nov. 7, 2022    (KR) ........................ 10-2022-0147370

(51) Int. Cl.
| | |
|---|---|
| *H10K 59/122* | (2023.01) |
| *H10K 59/12* | (2023.01) |
| *H10K 59/35* | (2023.01) |

(52) U.S. Cl.
CPC ....... *H10K 59/122* (2023.02); *H10K 59/1201* (2023.02); *H10K 59/353* (2023.02)

(58) Field of Classification Search
CPC . H10K 59/133; H10K 59/1201; H10K 59/353
See application file for complete search history.

(56) References Cited

U.S. PATENT DOCUMENTS

| | | | |
|---|---|---|---|
| 8,716,058 B2 | 5/2014 | Choi et al. | |
| 9,142,808 B2 | 9/2015 | Kim et al. | |
| 2004/0263072 A1 | 12/2004 | Park et al. | |
| 2012/0169217 A1* | 7/2012 | Kim | ...................... H10K 71/00 445/24 |
| 2017/0077196 A1 | 3/2017 | Kanda | |
| 2019/0067644 A1 | 2/2019 | Choi et al. | |
| 2019/0181199 A1* | 6/2019 | Choi | .................... H10K 59/124 |

(Continued)

FOREIGN PATENT DOCUMENTS

| | | |
|---|---|---|
| JP | 2017-59344 A | 3/2017 |
| KR | 10-0573138 B1 | 4/2006 |
| KR | 10-0667064 B1 | 1/2007 |

(Continued)

*Primary Examiner* — Mariceli Santiago
(74) *Attorney, Agent, or Firm* — Innovation Counsel LLP

(57) ABSTRACT

A display panel includes a substrate including first, second, and third emission areas, an organic insulating layer on the substrate, first, second, and third pixel electrodes on the organic insulating layer, a pixel-defining layer in which first, second, and third openings, and an out-gassing hole are defined. The first, second, and third openings extend to at least a portion of each of the first, second, and third pixel electrodes. First, second, and third emission layers are respectively on the first, second, and third pixel electrodes. The out-gassing hole includes first, second, and third out-gassing holes defined around the first, second, and third openings. An area of the first out-gassing hole is greater than areas of the second and third out-gassing holes.

9 Claims, 20 Drawing Sheets

(56)     References Cited

U.S. PATENT DOCUMENTS

| 2021/0020707 | A1* | 1/2021 | Choi | H10K 59/122 |
| 2021/0134911 | A1* | 5/2021 | Park | H10K 59/871 |

FOREIGN PATENT DOCUMENTS

| KR | 10-2012-0078954 | A | 7/2012 |
| KR | 10-1193196 | B1 | 10/2012 |
| KR | 10-1780814 | B1 | 9/2017 |
| KR | 10-2019-0023758 | A | 3/2019 |

* cited by examiner

DISPLAY DEVICE AND METHOD OF MANUFACTURING DISPLAY DEVICE

CROSS-REFERENCE TO RELATED APPLICATION

This application is based on and claims priority under 35 U.S.C. § 119 to Korean Patent Application No. 10-2022-0147370, filed on Nov. 7, 2022, in the Korean Intellectual Property Office, the disclosure of which is incorporated by reference herein in its entirety.

BACKGROUND

1. Field

One or more embodiments relate to a display device and a method of manufacturing the display device.

2. Description of the Related Art

An organic light-emitting diode includes two electrodes and an emission layer between the two electrodes. Excitons are formed from a combination of electrons injected from a cathode, which is one of the electrodes, and holes injected from an anode, which is another of the electrodes, in the emission layer, and light is emitted when the excitons emit energy.

An organic light-emitting display device produces images by using the organic light-emitting diodes described above and includes electrodes connected to the organic light-emitting diodes and an insulating layer for planarization and insulation between the electrodes. Recently, as a structure of an organic light-emitting display device becomes complicated, a plurality of insulating layers are included in the organic light-emitting display device.

SUMMARY

One or more embodiments provide a display panel having improved visibility and a method of manufacturing the display panel. However, this is merely an example, and the scope of the present disclosure is not limited thereto.

Additional aspects will be set forth in part in the description which follows and, in part, will be apparent from the description, or may be learned by practice of the presented embodiments of the disclosure.

According to one or more embodiments, a display panel includes a substrate, an organic insulating layer, a first pixel electrode, a second pixel electrode, a third pixel electrode, a pixel-defining layer, a first emission layer, a second emission layer, and a third emission layer. The substrate includes a first emission area, a second emission area, and a third emission area. The organic insulating layer is on the substrate. The first pixel electrode, the second pixel electrode, and the third pixel electrode are on the organic insulating layer. A first opening, a second opening, a third opening, and an out-gassing hole are defined in the pixel-defining layer. Each of the first opening, the second opening, and the third opening extends to at least a portion of each of the first pixel electrode, the second pixel electrode, and the third pixel electrode. The first emission layer, the second emission layer, and the third emission layer are respectively on the first pixel electrode, the second pixel electrode, and the third pixel electrode. The out-gassing hole includes a first out-gassing hole around the first opening, a second out-gassing hole around the second opening, and a third out-gassing hole around the third opening. An area of the first out-gassing hole is greater than an area of the second out-gassing hole and the area of the first out-gassing hole is greater than an area of the third out-gassing hole.

The area of the second out-gassing hole may be greater than the area of the third out-gassing hole.

The first emission area may be a light-emitting area of the first emission layer, the second emission area may be a light-emitting area of the second emission layer, and the third emission area may be a light-emitting area of the third emission layer.

The area of the first emission area may be less than the area of the second emission, and the area of the second emission area may be less than the area of the third emission area.

Distances between edges of the first opening, the second opening, and the third opening extending in a first direction to edges of the first emission area, the second emission area, and the third emission area extending in the first direction may be the same as each other, the distances being measured in a second direction crossing the first direction.

Green light, red light, and blue light may be emitted from the first emission area, the second emission area, and the third emission area, respectively.

The display panel may further include a first protective layer, a second protective layer, and a third protective layer respectively on the first pixel electrode, the second pixel electrode, and the third pixel electrode, except for portions of the first pixel electrode, the second pixel electrode, and the third pixel electrode to which the first opening, the second opening, and the third opening of the pixel-defining layer extend.

The pixel-defining layer may include an inorganic material.

The display panel may further include an opposite electrode on the first emission layer, the second emission layer, and the third emission layer.

According to one or more embodiments, a display panel includes a substrate, an organic insulating layer, a first pixel electrode, a second pixel electrode, a third pixel electrode, a pixel-defining layer, a first emission layer, a second emission layer, and a third emission layer. The substrate includes a first emission area, a second emission area, and a third emission area. The organic insulating layer is on the substrate. The first pixel electrode, the second pixel electrode, and the third pixel electrode are on the organic insulating layer. A first opening, a second opening, a third opening, and an out-gassing hole are defined in the pixel-defining layer. Each of the first opening, the second opening, and the third opening extends to at least a portion of each of the first pixel electrode, the second pixel electrode, and the third pixel electrode. The first emission layer, the second emission layer, and the third emission layer are respectively on the first pixel electrode, the second pixel electrode, and the third pixel electrode. The out-gassing hole includes a first out-gassing hole around the first opening, a second out-gassing hole around the second opening, and a third out-gassing hole around the third opening. A shortest distance from the first out-gassing hole to an edge of the first opening is less than a shortest distance from the second out-gassing hole to an edge of the second opening and the shortest distance from the first out-gassing hole to the edge of the first opening is less than a shortest distance from the third out-gassing hole to an edge of the third opening.

The shortest distance from the second out-gassing hole to the edge of the second opening may be less than the shortest distance from the third out-gassing hole to the edge of the third opening.

Distances between edges of the first opening, the second opening, and the third opening extending in a first direction to edges of the first emission area, the second emission area, and the third emission area extending in the first direction may be the same as each other, the distances being measured in a second direction crossing the first direction.

The pixel-defining layer may include an inorganic material.

According to one or more embodiments, a method of manufacturing a display panel, includes providing a substrate including a first emission area, a second emission area, and a third emission area. An organic insulating layer is formed on the substrate. A first pixel electrode, a second pixel electrode, and a third pixel electrode are formed on the organic insulating layer. A first protective layer, a second protective layer, and a third protective layer are formed on the first pixel electrode, the second pixel electrode, and the third pixel electrode, respectively. A material for forming a pixel-defining layer on the first protective layer, the second protective layer, and the third protective layer is formed. The pixel-defining layer, in which an out-gassing hole, a first opening, a second opening, and a third opening are defined by patterning the material is formed. At least a portion of each of the first protective layer, the second protective layer, and the third protective layer is exposed through each of the first opening, the second opening, and the third opening. The first protective layer, the second protective layer, and the third protective layer respectively exposed through the first opening, the second opening, and the third opening are removed. A first emission layer, a second emission layer, and a third emission layer are formed on the first pixel electrode, the second pixel electrode, and the third pixel electrode.

The out-gassing hole may include a first out-gassing hole around the first opening, a second out-gassing hole around the second opening, and a third out-gassing hole around the third opening.

The area of the first out-gassing hole may be greater than the area of the second out-gassing hole and the area of the first out-gassing hole may be greater than the area of the third out-gassing hole.

The area of the second out-gassing hole may be greater than the area of the third out-gassing hole.

A shortest distance from the first out-gassing hole to an edge of the first opening may be less than a shortest distance from the second out-gassing hole to an edge of the second opening and the shortest distance from the first out-gassing hole to the edge of the first opening is less than a shortest distance from the third out-gassing hole to an edge of the third opening.

The shortest distance from the second out-gassing hole to the edge of the second opening may be less than the shortest distance from the third out-gassing hole to the edge of the third opening.

The method may further include forming an opposite electrode on the first emission layer, the second emission layer, and the third emission layer.

BRIEF DESCRIPTION OF THE DRAWINGS

The above and other aspects, features, and advantages of certain embodiments of the disclosure will be more apparent from the following description taken in conjunction with the accompanying drawings.

FIGS. 2A and 2B are schematic cross-sectional views of a display device according to an embodiment.

DETAILED DESCRIPTION

Figure 1:
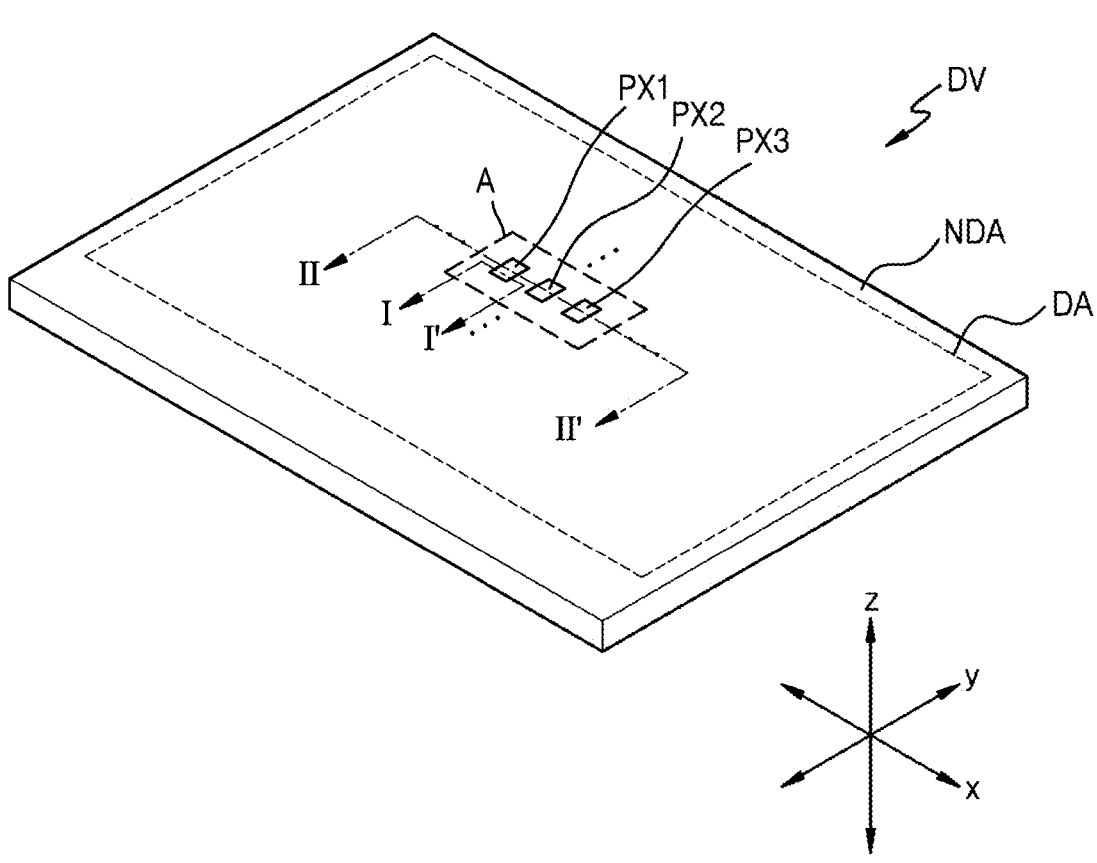
FIG. 1 is a schematic perspective view of a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

As the disclosure allows for various changes and numerous embodiments, particular embodiments will be shown in the drawings and described in detail in the written description. The attached drawings for illustrating embodiments of the present disclosure are referred to in order to gain a sufficient understanding of the present disclosure, the merits thereof, and the features accomplished by the implementation of the present disclosure. The disclosure may, however, be embodied in many different forms and should not be construed as being limited to the embodiments set forth herein.

Hereinafter, one or more embodiments of the disclosure will be described in detail with reference to the accompanying drawings. Like elements in the drawings denote like elements, and repeated descriptions thereof are omitted.

It will be understood that although the terms "first", "second," etc. may be used herein to describe various elements, these elements should not be limited by these terms, and these elements are only used to distinguish one element from another.

As used herein, the singular forms "a," "an" and "the" are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, region, or element, it can be directly or indirectly formed on the other layer, region, or element. That is, for example, intervening layers, regions, or elements may be present.

Sizes of elements in the drawings may be exaggerated for convenience of explanation. In other words, since sizes and thicknesses of elements in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the present embodiment, an expression such as "A and/or B" indicates A, B, or A and B. Also, an expression such as "at least one of A and B" indicates A, B, or A and B.

It will be understood that when a layer, region, or component is referred to as being connected to another layer, region, or component, it can be directly and/or indirectly connected to the other layer, region, or component. That is, for example, intervening layers, regions, or components may be present. For example, when a layer, region, or component is referred to as being electrically connected to another layer, region, or component, it can be directly or indirectly electrically connected to the other layer, region, or component.

In the following examples, the x-axis, the y-axis, and the z-axis are the three axes of the rectangular coordinate system, but may be interpreted in a broader sense. For example, the x-axis, the y-axis, and the z-axis may be perpendicular to one another, or may represent different directions that are not perpendicular to one another.

FIG. 1 is a schematic perspective view of a display device DV according to an embodiment.

Referring to FIG. 1, the display device DV may include a display area DA and a non-display area NDA outside the display area DA. The display device DV may provide images through an array of pixels that are two-dimensionally arranged in an x-y plane in the display area DA. Pixels PX include a first pixel PX1, a second pixel PX2, and a third pixel PX3, and hereinafter, the first pixel PX1 is a green pixel, the second pixel PX2 is a red pixel, and the third pixel PX3 is a blue pixel for convenience of explanation.

The green pixel, the red pixel, and the blue pixel are areas where green light, red light, and blue light may be emitted, respectively, and the display device DV may provide images by using light emitted from the pixels PX.

The non-display area NDA may be an area where no images are displayed and may entirely surround the display area DA. In the non-display area NDA, drivers or main voltage lines configured to provide electrical signals or power to pixel circuits may be included. In the non-display area NDA, a pad that may be electrically connected to an electronic component or a printed circuit board may be included.

The display area DA may have a polygonal shape including a rectangular shape, as shown in FIG. 1. For example, the display area DA may have a rectangular shape in which a horizontal length is greater than a vertical length or the horizontal length is less than the vertical length, or may have a square shape. Alternatively, the display area DA may have various shapes such as an oval shape or a circular shape.

Figure 2A:
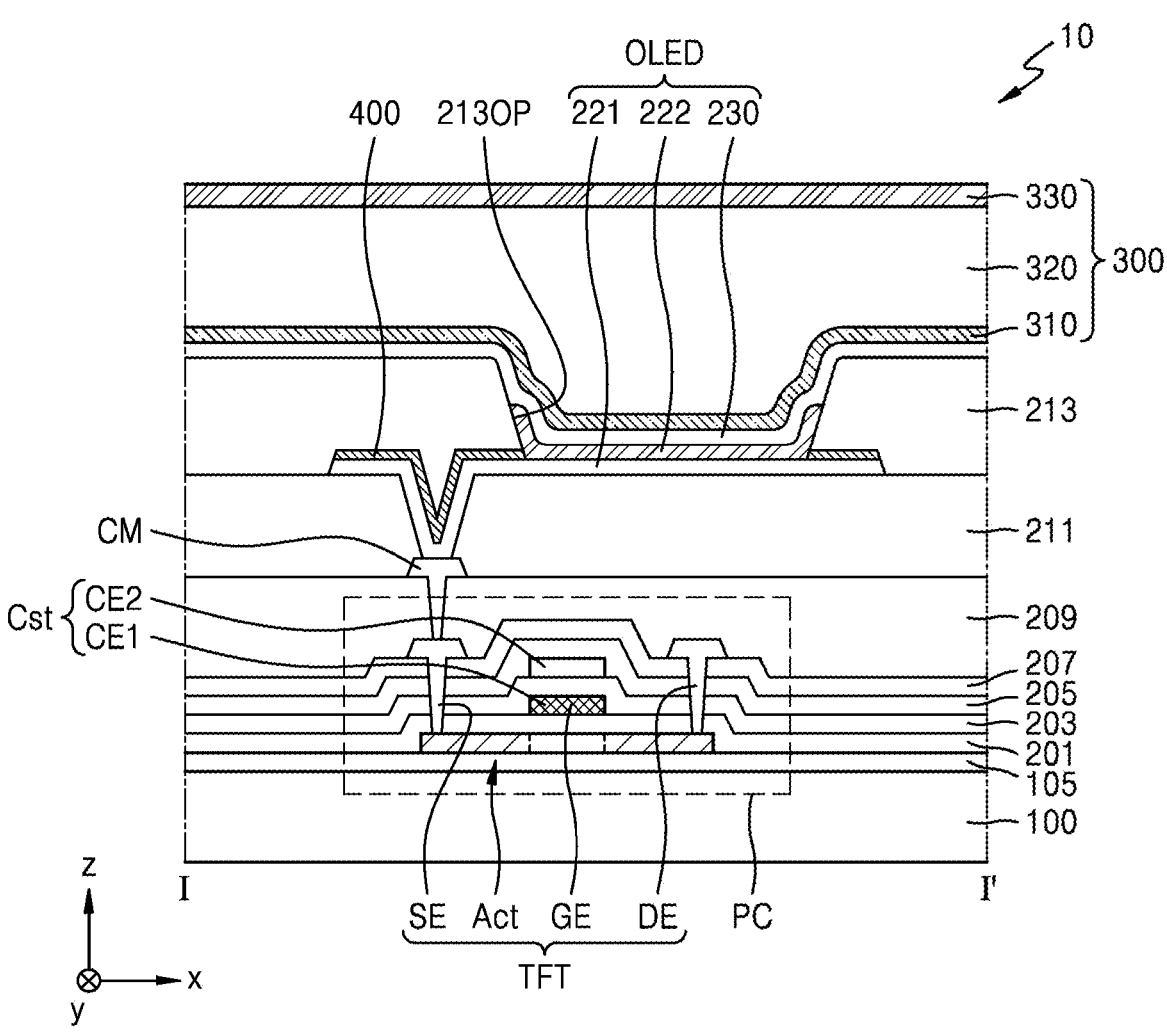
Figure 2B:
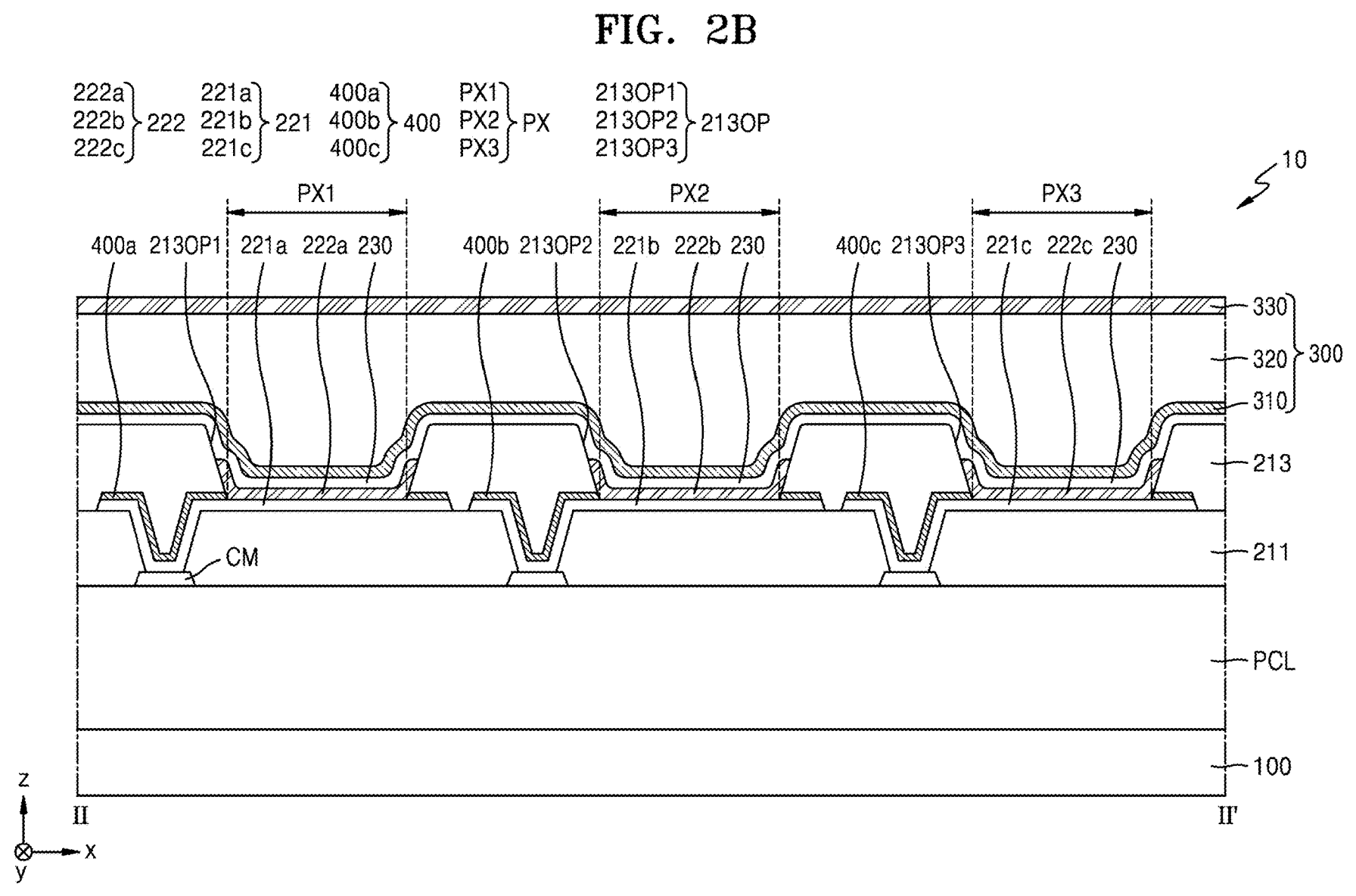

FIGS. 2A and 2B are schematic cross-sectional views of a display device according to an embodiment. In detail, FIG. 2A is a schematic cross-sectional view of the display device DV of FIG. 1, taken along a line I-I' of FIG. 1. FIG. 2B is a schematic cross-sectional view of the display device DV of FIG. 1, taken along a line II-II' of FIG. 1.

Referring to FIGS. 2A and 2B, a substrate 100 may include a glass material or polymer resin. When the substrate 100 includes polymer resin, the substrate 100 may include polymer resin such as polyether sulfone, polyarylate, polyetherimide, polyethylene naphthalate, polyethylene terephthalate, polyphenylene sulfide, polyimide, polycarbonate, or cellulose acetate propionate.

Although not shown, the substrate 100 may include a first base layer, a first barrier layer, a second base layer, and a second barrier layer. In an embodiment, the first base layer, the first barrier layer, the second base layer, and the second barrier layer may be sequentially stacked in a thickness, e.g., Z-axis, direction of the substrate 100.

The first barrier layer and the second barrier layer may prevent external impurities from penetrating and may be a layer or layers including inorganic materials such as silicon nitride (SiNx), silicon oxide (SiOx), and/or silicon oxynitride (SiON).

A buffer layer 105 may be disposed on the substrate 100, wherein the buffer layer 105 is formed to prevent impurities from penetrating a semiconductor layer Act of a thin-film transistor TFT. The buffer layer 105 may include inorganic insulating materials such as SiNx, SiON, and SiOx and may be a layer or layers including the inorganic insulating materials.

A pixel circuit PC may be disposed on the buffer layer 105. The pixel circuit PC includes the thin-film transistor TFT and a storage capacitor Cst. The thin-film transistor TFT may include the semiconductor layer Act, a gate electrode GE, a source electrode SE, and a drain electrode DE. In the present embodiment, the thin-film transistor TFT is of a top-gate type in which the gate electrode GE is disposed above the semiconductor layer Act with a first insulating layer 201 between the gate electrode GE and the semiconductor layer Act, but in an embodiment, the thin-film transistor TFT may be of a bottom-gate type.

The semiconductor layer Act may include polysilicon. Alternatively, the semiconductor layer Act may include amorphous silicon, an oxide semiconductor, an organic semiconductor, or the like. The gate electrode GE may include a low-resistive metal material. The gate electrode GE may include a conductive material including molybdenum (Mo), aluminum (Al), copper (Cu), or titanium (Ti) and may be a layer or layers including the above material.

The first insulating layer 201 between the semiconductor layer Act and the gate electrode GE may include an inorganic insulating material such as SiOx, SiNx, SiON, aluminum oxide ($Al_2O_3$), titanium oxide ($TiO_2$), tantalum oxide ($Ta_2O_5$), and hafnium oxide ($HfO_2$). The first insulating layer 201 may be a layer or layers including the above material.

The source electrode SE and the drain electrode DE may include materials with good conductivity. The source electrode SE and the drain electrode DE may each include a conductive material including Mo, Al, Cu, or Ti and may be a layer or layers including the above material. In an embodiment, the source electrode SE, the drain electrode DE, and a data line DL, e.g., see FIG. 3, may have a multilayered structure of a Ti layer, an Al layer, and a Ti layer (Ti/Al/Ti).

The storage capacitor Cst may include a lower electrode CE1 and an upper electrode CE2 that overlap each other with a second insulating layer 203 between the lower electrode CE1 and the upper electrode CE2. The storage capacitor Cst may overlap the thin-film transistor TFT. FIG. 2A shows that the gate electrode GE of the thin-film transistor TFT is the lower electrode CE1 of the storage capacitor Cst. In an embodiment, the storage capacitor Cst may not overlap the thin-film transistor TFT. The storage capacitor Cst may be covered by a third insulating layer 205. The upper electrode CE2 of the storage capacitor Cst may include a conductive material including Mo, Al, Cu, or Ti and may be a layer or layers including the above material.

A fourth insulating layer 207 may be disposed on the third insulating layer 205. The second insulating layer 203, the third insulating layer 205, and the fourth insulating layer 207 may include inorganic insulating materials such as SiOx, SiNx, SiON, $Al_2O_3$, $TiO_2$, $Ta_2O_5$, and $HfO_2$. The second insulating layer 203, the third insulating layer 205, and the fourth insulating layer 207 may each be a layer or layers including the above materials.

The pixel circuit PC including the thin-film transistor TFT and the storage capacitor Cst may be covered by a first organic insulating layer 209. The first organic insulating layer 209 may include a substantially flat upper surface.

The pixel circuit PC may be electrically connected to a pixel electrode 221. For example, as shown in FIG. 2A, a connection electrode CM may be between the thin-film transistor TFT and the pixel electrode 221. The connection electrode CM may contact the thin-film transistor TFT through a contact hole formed in the first organic insulating layer 209, and the pixel electrode 221 may contact the connection electrode CM through a contact hole formed in a second organic insulating layer 211 disposed on the connection electrode CM. The connection electrode CE may include a conductive material including Mo, Al, Cu, or Ti and may be a layer or layers including the above material. For example, the connection electrode CE may have a multilayered structure of Ti/A/Ti.

The first organic insulating layer 209 and the second organic insulating layer 211 may each include organic insulating materials such as a general-purpose polymer such as polymethylmethacrylate (PMMA) or polystyrene (PS), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, and any blend thereof. In an embodiment, the first organic insulating layer 209 and the second organic insulating layer 211 may include polyimide.

The pixel electrode 221 may be formed on the second organic insulating layer 211. The pixel electrode 221 may include conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 221 may include a reflection film including silver (Ag), magnesium (Mg), Al, platinum (Pt), palladium (Pd), gold (Au), nickel (Ni), neodymium (Nd), iridium (Ir), chromium (Cr), or a compound thereof. In an embodiment, the pixel electrode 210 may further include a film including ITO, IZO, ZnO, or $In_2O_3$ on/under the above reflection film.

A protective layer 400 may be formed on a portion of the pixel electrode 221 that is covered by and not exposed by a pixel-defining layer 213. The protective layer 400 may protect the pixel electrode 221 from plasma during a process of patterning the pixel-defining layer 213. The protective layer 400 may include conductive oxide, such as ITO, IZO, ZnO, $In_2O_3$, IGO, AZO, or other materials.

The pixel-defining layer 213 may be formed on the pixel electrode 221. The pixel-defining layer 213 may include an opening 213OP extending to and exposing at least a portion of an upper surface of the pixel electrode 221 and cover edges of the pixel electrode 221.

The pixel-defining layer 213 may include an inorganic material. The pixel-defining layer 213 may be a layer or layers including SiOx, SiNx, and/or SiON. However, in an embodiment, the pixel-defining layer 213 may include an organic material. The pixel-defining layer 213 may include one or more organic insulating materials selected from the group consisting of polyimide, polyamide, an acryl resin layer, BCB, and a phenol resin layer.

An emission layer 222 may be disposed on the pixel electrode 221. In detail, the emission layer 222 may be disposed on the pixel electrode 221 and inner side surfaces of the pixel-defining layer 213 that form the opening 213OP of the pixel-defining layer 213. The emission layer 222 may include a high-molecular-weight organic material or a low-molecular-weight organic material emitting a certain color of light.

Although not shown, a first functional layer may be disposed under the emission layer 222, and a second functional layer may be disposed on the emission layer 222. The first functional layer and the second functional layer may continuously cover the substrate 100 or partially cover the substrate.

The first functional layer may be a layer or layers. For example, when the first functional layer includes a high-molecular-weight material, the first functional layer may be a Hole Transport Layer (HTL) having a single-layer structure and include poly-(3,4)-ethylene-dihydroxy thiophene (PEDOT) or polyaniline (PANI). When the first functional layer includes a low-molecular-weight material, the first functional layer may include a Hole Injection Layer (HIL) and an HTL.

The second functional layer is not always included. For example, when the first functional layer and the emission layer 222 each include a high-molecular-weight material, it is suitable to form the second functional layer. The second functional layer may be a layer or layers. The second functional layer may include an Electron Transport Layer (ETL) and/or an Electron Injection Layer (EIL).

The emission layer 222 may be in each pixel in the display area DA. The emission layer 222 may be patterned to correspond to the pixel electrode 221. Unlike the emission layer 222, the first functional layer and/or the second functional layer may extend towards an intermediate area to be located in both the display area DA and the intermediate area.

An opposite electrode 230 may include a conductive material having a low work function. For example, the opposite electrode 230 may include a transparent (or translucent) layer including Ag, Mg, Al, Pt, Pd, Au, Ni, Nd, Ir, Cr, lithium (Li), calcium (Ca), or an alloy thereof. Alternatively, the opposite electrode 230 may further include a layer including ITO, IZO, ZnO, or $In_2O_3$ on the transparent (or translucent) layer including the above material. The opposite electrode 230 may be formed in the display area DA as well as the intermediate area. The first functional layer, the second functional layer, and the opposite electrode 230 may be formed through thermal deposition.

Although not shown, a capping layer may be disposed on the opposite electrode 230. For example, the capping layer may include LiF and may be formed through thermal deposition. In some embodiments, the capping layer may be omitted.

An organic light-emitting diode OLED may be covered by a thin-film encapsulation layer 300. The thin-film encapsulation layer 300 may include at least one organic encapsulation layer and at least one inorganic encapsulation layer. FIG. 2A shows that the thin-film encapsulation layer 300 includes a first inorganic encapsulation layer 310 and a second inorganic encapsulation layer 330 and an organic encapsulation layer 320 between the first inorganic encapsulation layer 310 and the second inorganic encapsulation layer 330. In an embodiment, the number of organic encapsulation layers and the number of inorganic encapsulation layers and stacking orders thereof may change.

The first inorganic encapsulation layer 310 and the second inorganic encapsulation layer 330 may include one or more inorganic materials from among $Al_2O_3$, $TiO_2$, $Ta_2O_5$, and $HfO_2$, ZnO, SiOx, SiNx, and SION. The first inorganic encapsulation layer 310 and the second inorganic encapsulation layer 330 may each be a layer or layers including the above materials. The organic encapsulation layer 320 may include a polymer-based material. The polymer-based material may include acrylic resin, for example, polymethyl methacrylate or polyacrylic acid, epoxy-based resin, polyimide, polyethylene, or the like. In an embodiment, the organic encapsulation layer 320 may include an acrylate polymer.

Materials in the first inorganic encapsulation layer 310 and the second inorganic encapsulation layer 330 may be different from each other. For example, the first inorganic encapsulation layer 310 may include SiON, whereas the second inorganic encapsulation layer 330 may include SiNx. A thickness of the first inorganic encapsulation layer 310 may be different from that of the second inorganic encapsulation layer 330. The thickness of the first inorganic encapsulation layer 310 may be greater than that of the second inorganic encapsulation layer 330. Alternatively, the thickness of the second inorganic encapsulation layer 330 may be greater than or the same as that of the first inorganic encapsulation layer 310.

FIG. 2B is a cross-sectional view of the display device DV according to an embodiment and schematically shows the first pixel PX1, the second pixel PX2, and the third pixel PX3.

Referring to FIG. 2B, the first pixel PX1, the second pixel PX2, and the third pixel PX3 may be disposed on a display panel 10. A pixel circuit layer PCL may be disposed on the substrate 100. The pixel circuit layer PCL may include the inorganic insulating layers 201, 203, 205, and 207, the organic insulating layer 209, the thin-film transistor TFT, the storage capacitor Cst, and the like. The second organic insulating layer 211 may be disposed on the pixel circuit layer PCL. The second organic insulating layer 211 may be partially patterned. In other words, a plurality of openings may be defined in the second organic insulating layer 211. At least a portion of the connection electrode CM may be exposed by the openings defined in the second organic insulating layer 211. On the connection electrode CM, a first pixel electrode 221a, a second pixel electrode 221b, and a third pixel electrode 221c may be disposed.

The protective layer 400 may be disposed on the pixel electrode 221. In detail, a first protective layer 400a may be disposed on the first pixel electrode 221a, and a second protective layer 400b may be disposed on the second pixel electrode 221b. Also, a third protective layer 400c may be disposed on the third pixel electrode 221c.

In an embodiment, the pixel-defining layer 213 may be disposed on the protective layer 400. In other words, the pixel-defining layer 213 may be disposed on the first protective layer 400a, the second protective layer 400b, and the third protective layer 400c. The pixel-defining layer 213 may include the openings 213OP. At least a portion of the protective layer 400 may be exposed by the openings 213OP of the pixel-defining layer 213 during manufacturing. In detail, at least a portion of the first protective layer 400a may be exposed by a first opening 213OP1 of the pixel-defining layer 213, and at least a portion of the second protective layer 400b may be exposed by a second opening 213OP2 of the pixel-defining layer 213. Also, at least a portion of the third protective layer 400c may be exposed by a third opening 213OP3 of the pixel-defining layer 213.

The protective layer 400 exposed by the opening 213OP of the pixel-defining layer 213 may be removed as shown in FIGS. 2A and 2B. In other words, the protective layer 400 may not be in the opening 213OP of the pixel-defining layer 213. The first protective layer 400a may not be in the first opening 213OP1 of the pixel-defining layer 213, and the second protective layer 400b may not be in the second opening 213OP2 of the pixel-defining layer 213. Also, the third protective layer 400c may not be in the third opening 213OP3 of the pixel-defining layer 213.

In an embodiment, the emission layer 222 may be disposed on the pixel electrode 221 exposed by the opening 213OP of the pixel-defining layer 213. In detail, a first emission layer 222a may be disposed on the first pixel electrode 221a, and a second emission layer 222b may be disposed on the second pixel electrode 221b. Also, a third emission layer 222c may be disposed on the third pixel electrode 221c.

The opposite electrode 230 may be disposed on the emission layer 222. In other words, the opposite electrode 230 may be disposed on the first emission layer 222a, the second emission layer 222b, and the third emission layer 222c. The thin-film encapsulation layer 300 may be disposed on the opposite electrode 230. The thin-film encapsulation layer 300 may include the first inorganic encapsulation layer 310, the second inorganic encapsulation layer 330, and the organic encapsulation layer 320 between the first inorganic encapsulation layer 310 and the second inorganic encapsulation layer 330.

The first pixel electrode 221a, the first emission layer 222a, and the opposite electrode 230, which are disposed above the substrate 100, may form the first pixel PX1. In other words, the first pixel PX1 may include the first pixel electrode 221a, the first emission layer 222a, and the opposite electrode 230. The second pixel electrode 221b, the second emission layer 222b, and the opposite electrode 230 may form the second pixel PX2. In other words, the second pixel PX2 may include the second pixel electrode 221b, the second emission layer 222b, and the opposite electrode 230. The third pixel electrode 221c, the third emission layer 222c, and the opposite electrode 230 may form the third pixel PX3. In other words, the third pixel PX3 may include the third pixel electrode 221c, the third emission layer 222c, and the opposite electrode 230.

Figure 3:
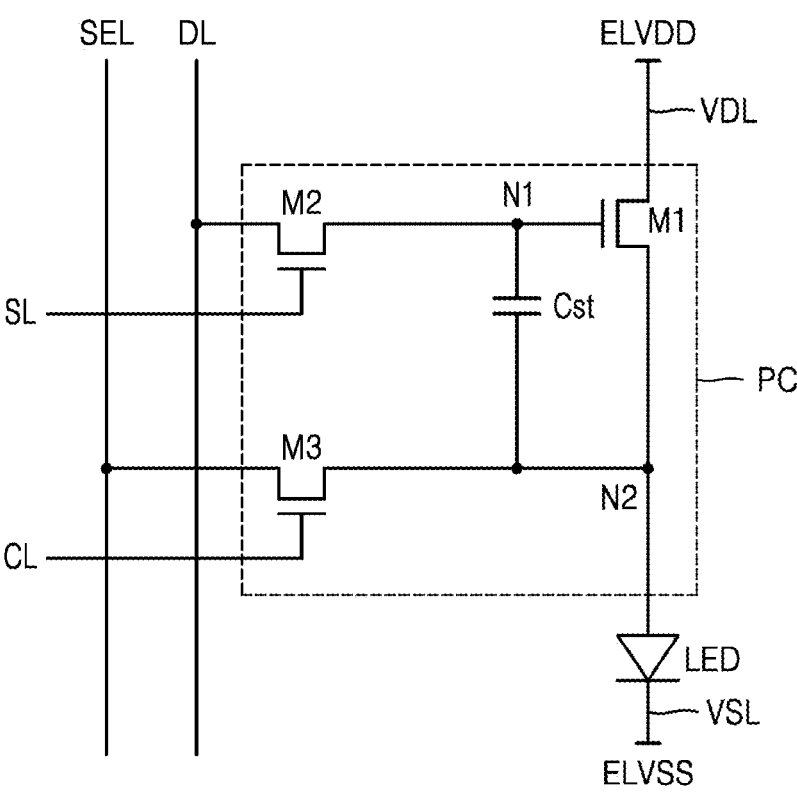
FIG. 3 is an equivalent circuit diagram of a light-emitting diode and a pixel circuit electrically connected to the light-emitting diode, which are included in a display device, according to an embodiment.

FIG. 3 is an equivalent circuit diagram of a light-emitting diode LED and a pixel circuit PC electrically connected to the light-emitting diode LED, which are included in a display device, according to an embodiment.

Referring to FIG. 3, a pixel electrode, e.g., an anode, of a light-emitting diode, e.g., the light-emitting diode LED, may be connected to the pixel circuit PC, and an opposite electrode, e.g., a cathode, of the light-emitting diode LED may be connected to a common voltage line VSL configured to provide a common power voltage ELVSS. The light-emitting diode LED may emit light at a brightness corresponding to the amount of current provided from the pixel circuit PC.

The light-emitting diode LED of FIG. 3 may correspond to the organic light-emitting diode OLED of FIG. 2A, and the pixel circuit PC of FIG. 3 may correspond to the pixel circuit PC of FIG. 2A.

The pixel circuit PC may control the amount of current flowing to the common power voltage ELVSS from a driving power voltage ELVDD via the light-emitting diode LED, in response to a data signal. The pixel circuit PC may include a driving transistor M1, a switching transistor M2, a sensing transistor M3, and a storage capacitor Cst.

The driving transistor M1, the switching transistor M2, and the sensing transistor M3 may each be an oxide semiconductor thin-film transistor including a semiconductor layer including an oxide semiconductor, or a silicon semiconductor thin-film transistor including a semiconductor layer including polysilicon. The driving transistor M1, the switching transistor M2, and the sensing transistor M3 may each include a source electrode (or a source area) and a drain electrode (or a drain area).

The source electrode (or the source area) of the driving transistor M1 may be connected to the driving voltage line VDL configured to provide the driving power voltage ELVDD, and the drain electrode (or the drain area) of the driving transistor M1 may be connected to the pixel electrode, e.g., the anode, of the light-emitting diode LED. A gate electrode of the driving transistor M1 may be connected to a first node N1. The driving transistor M1 may control the amount of current flowing in the light-emitting diode LED from the driving power voltage ELVDD according to a voltage of the first node N1, but the locations of the source electrode (or the source area) and the drain electrode (or the drain area) of the driving transistor M1 may change.

The source electrode (or the source area) of the switching transistor M2 may be connected to the data line DL, and the drain electrode (or the drain area) of the switching transistor M2 may be connected to the first node N1. A gate electrode of the switching transistor M2 may be connected to a scan line SL. The switching transistor M2 may be turned on when a scan signal is provided to a scan line SL and may electrically connect the data line DL to the first node N1. However, the locations of the source electrode (or the source area) and the drain electrode (or the drain area) of the switching transistor M2 may change.

The drain electrode (or the drain area) of the sensing transistor M3 may be connected to a second node N2, and the source electrode (or the source area) of the sensing transistor M3 may be connected to a sensing line SEL. A gate electrode of the sensing transistor M3 may be connected to a control line CL. However, the locations of the source electrode (or the source area) and the drain electrode (or the drain area) of the sensing transistor M3 may change.

The storage capacitor Cst may be connected between the first node N1 and the second node N2. For example, a first capacitor electrode of the storage capacitor Cst may be connected to the gate electrode of the driving transistor M1, and a second capacitor electrode of the storage capacitor Cst may be connected to the first electrode of the light-emitting diode LED.

FIG. 3 shows the driving transistor M1, the switching transistor M2, and the sensing transistor M3 each are an NMOS transistor. However, in an embodiment, at least one of the driving transistor M1, the switching transistor M2, and the sensing transistor M3 may be a PMOS transistor.

FIG. 3 shows three transistors, but in an embodiment, the pixel circuit PC may include four or more transistors.

Figure 4A:
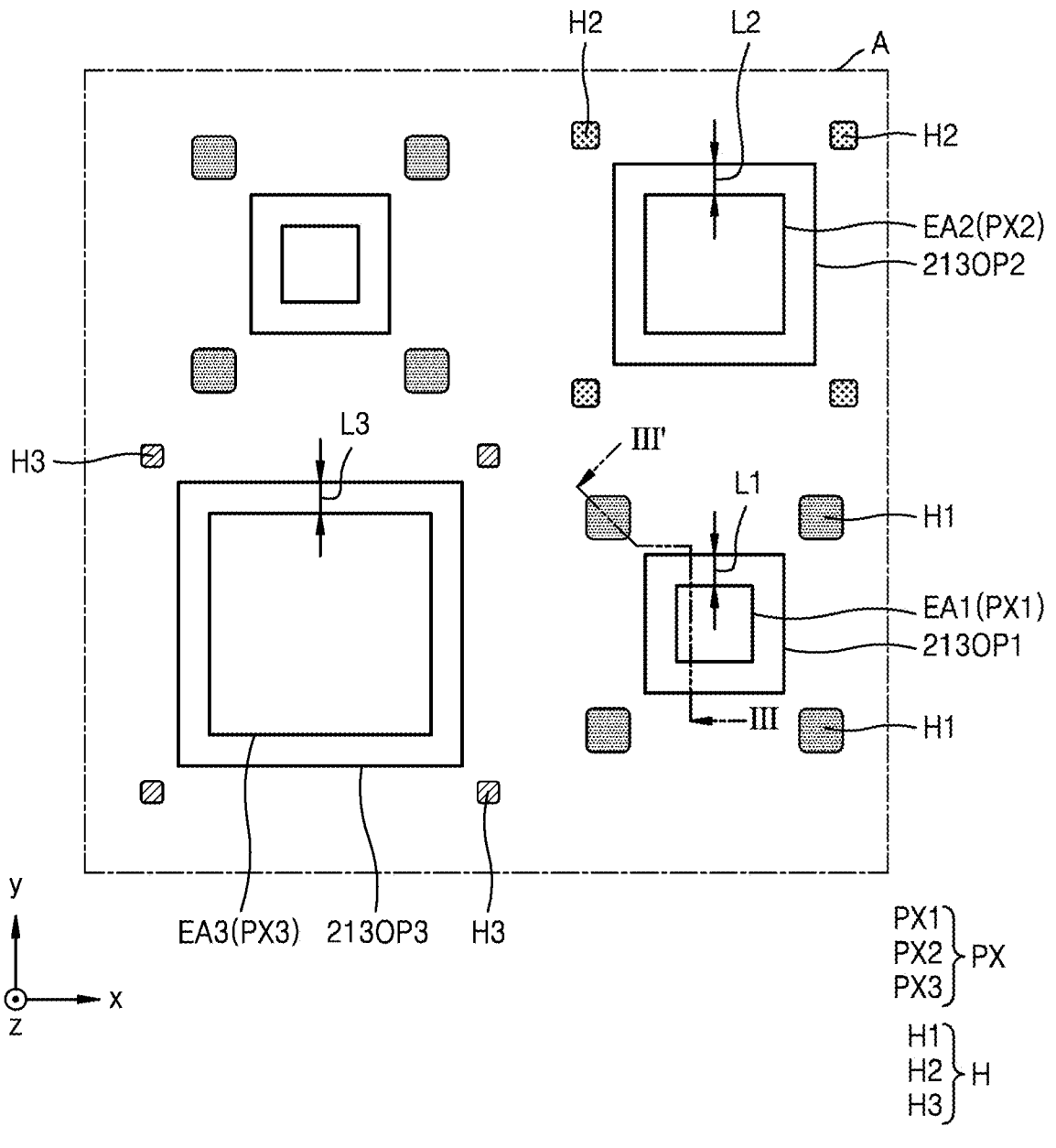
FIGS. 4A, 4B, and 4C are schematic plan views of a display panel according to an embodiment.
Figure 4B:
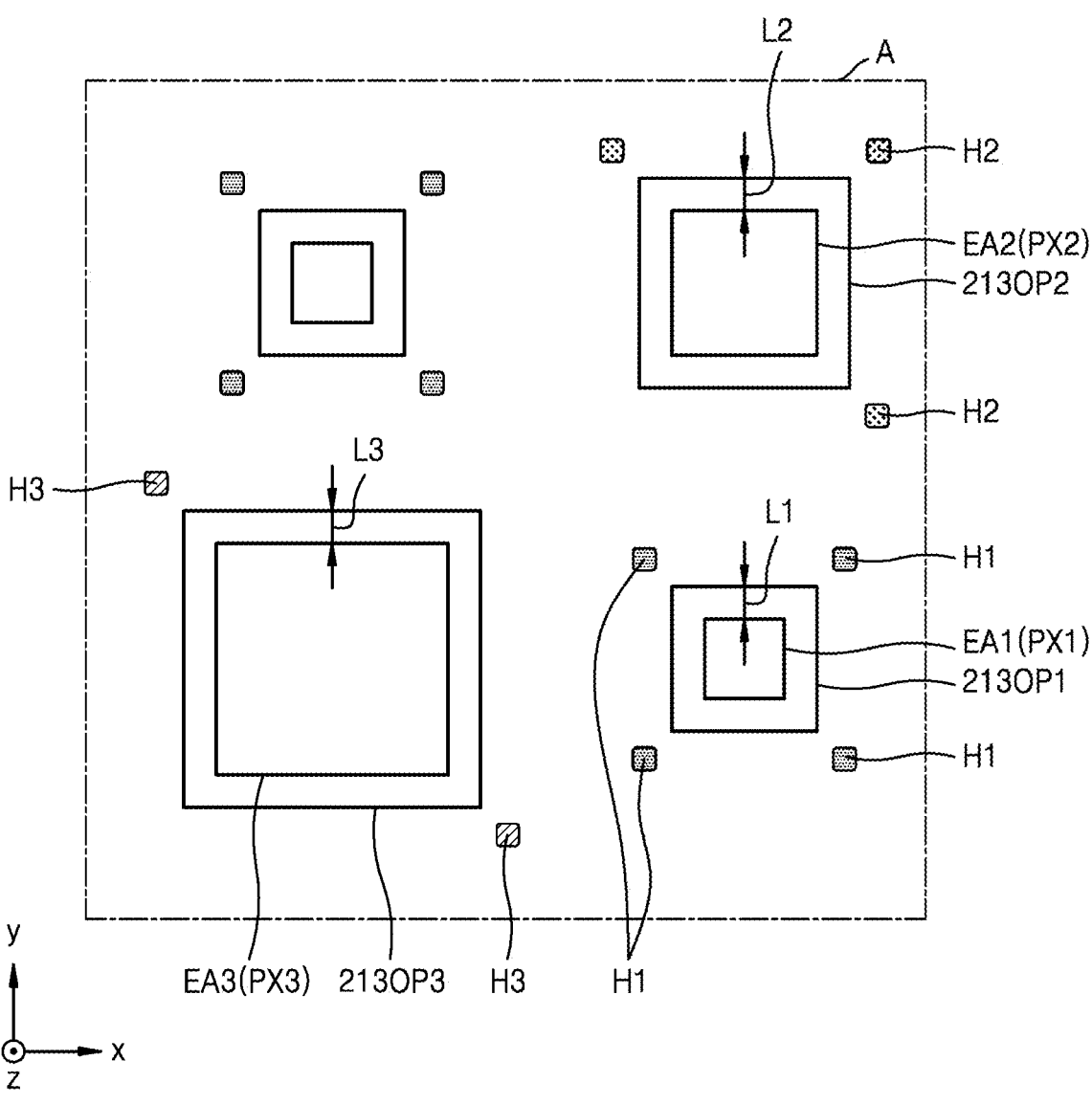
Figure 4C:
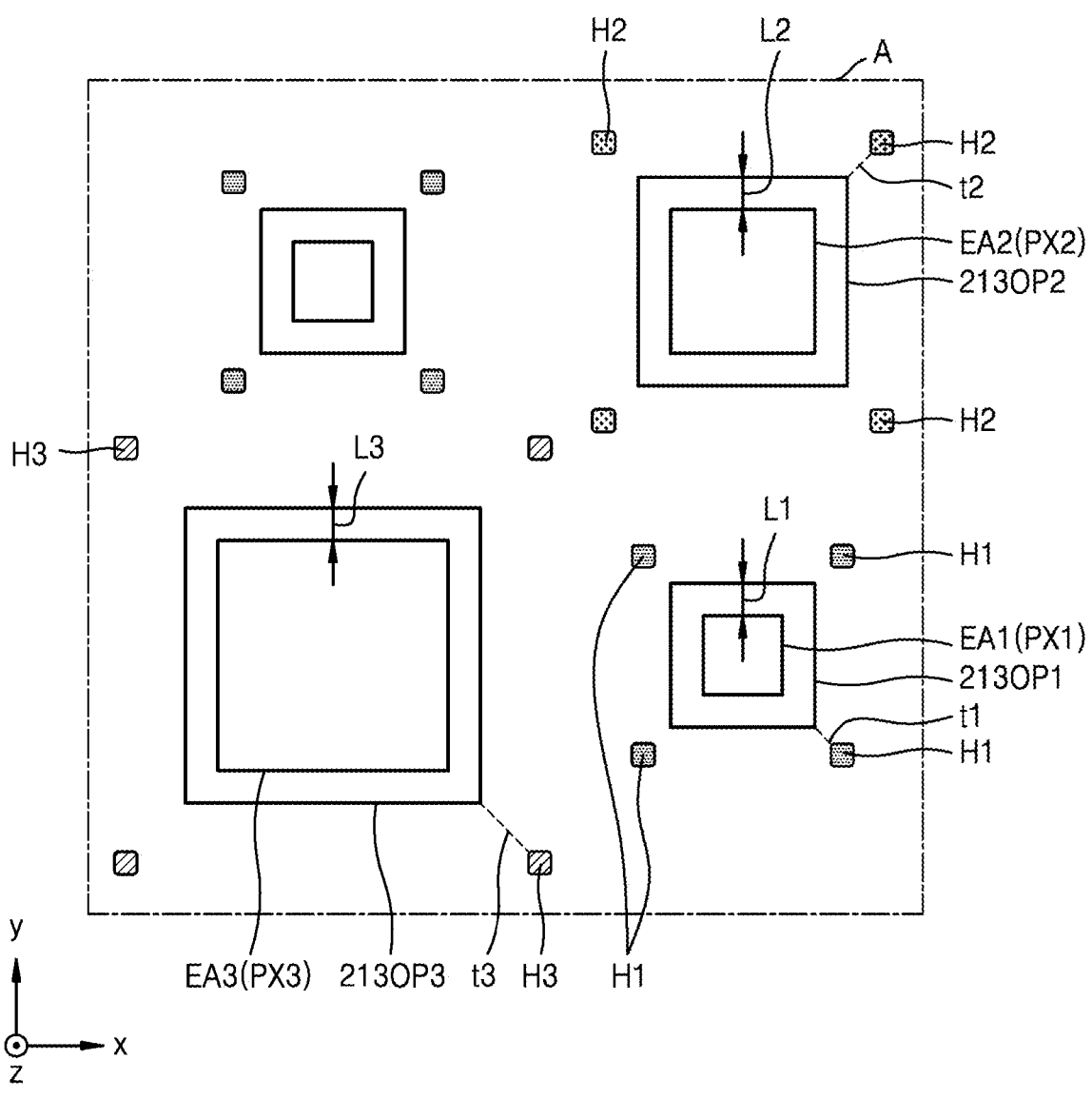
Figure 5:
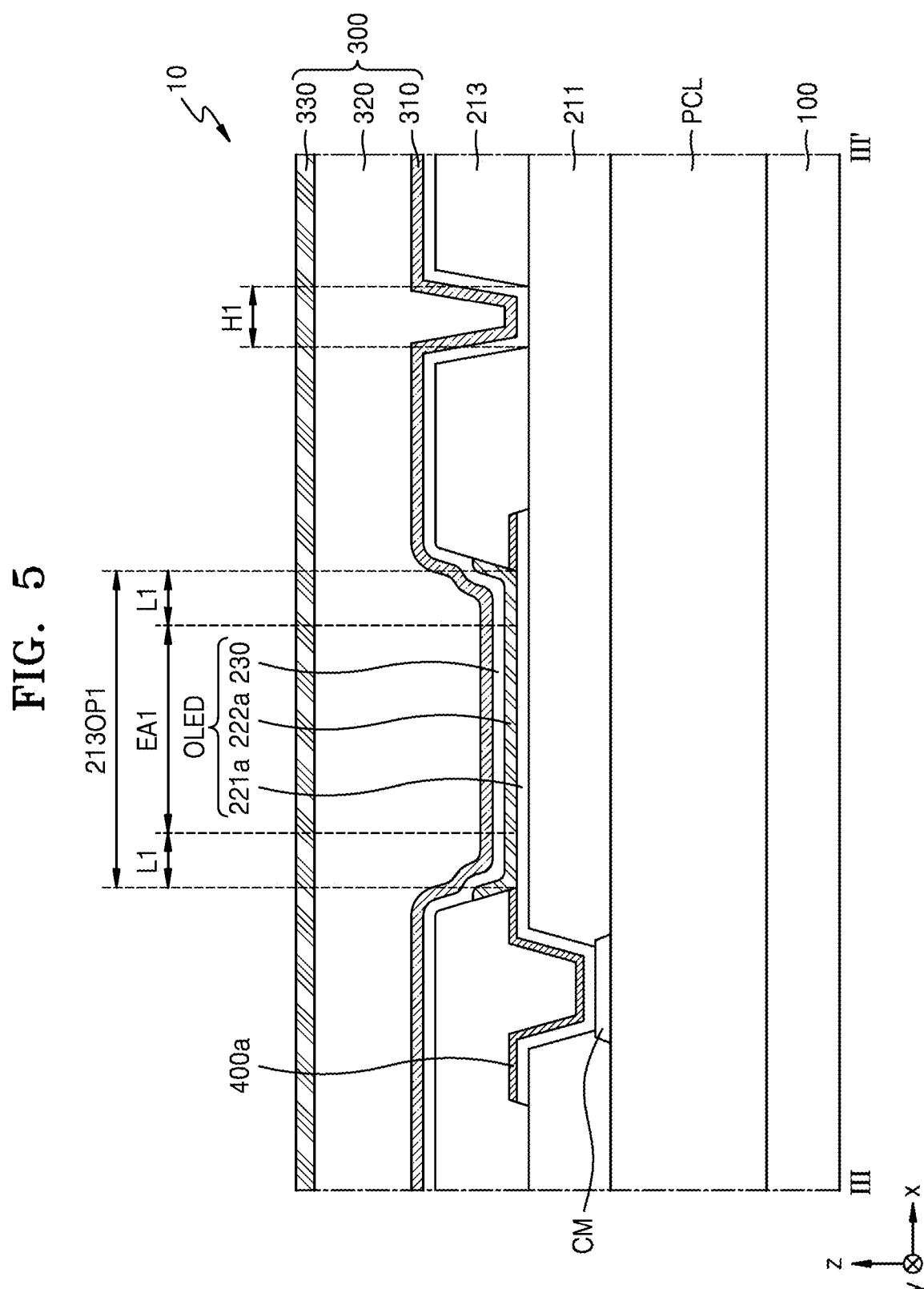
FIG. 5 is a schematic cross-sectional view of the display panel of FIG. 4A, taken along a line III-III' of FIG. 4A.

FIGS. 4A to 4C are schematic plan views of a display panel according to an embodiment. In detail, FIGS. 4A to 4C are schematic plan views of an enlarged region A in the display device DV of FIG. 1, according to an embodiment. FIG. 5 is a schematic cross-sectional view of the display panel of FIG. 4A, taken along a line III-III' of FIG. 4A.

Referring to FIGS. 4A to 5, a plurality of pixels PX may be repeatedly arranged in the display device DV. The pixels PX may be variously arranged. For example, the pixels PX may be arranged in various structures, for example, a Pentile structure, a stripe structure, a mosaic arrangement structure, a delta arrangement structure, or other structure.

Shapes of the pixels PX may vary. FIGS. 4A to 4C show that the pixels PX have square shapes in a plan view, e.g., in an xy plane, but have other shapes in other embodiments. For example, in the plan view, e.g., in the xy plane, the shapes of the pixels PX may be a rhombus, a triangle, a polygon, a track, or an oval.

The pixels PX are areas where light is emitted and may be defined as emission areas EA1, EA2, and EA3. The first pixel PX1 may be defined as a first emission area EA1 where green light is emitted, the second pixel PX2 may be defined as a second emission area EA2 where red light is emitted, and the third pixel PX3 may be defined as a third emission area EA3 where blue light is emitted. In other words, the green light may be emitted in the first emission area EA1, the red light may be emitted in the second emission area EA2, and the blue light may be emitted in the third emission area EA3. Hereinafter, for convenience of explanation, the first pixel PX1, the second pixel PX2, and the third pixel PX3 are referred to as the first emission area EA1, the second emission area EA2, and the third emission area EA3, respectively.

The first to third emission areas EA1 to EA3 may be defined as light-emitting portions of the emission layer 222, e.g., see FIG. 2B. The first emission area EA1 may be defined as a light-emitting portion of the first emission layer 222a, and the second emission area EA2 may be defined as a light-emitting portion of the second emission layer 222b, e.g., see FIG. 2B. Also, the third emission area EA3 may be defined as a light-emitting portion of the third emission layer 222c, e.g., see FIG. 2B.

In a high-temperature and high-humidity environment, gases may be generated from the second organic insulating layer 211 included in the display panel 10, because of a condensation reaction. When the pixel-defining layer 213 includes an organic material, gases may also be generated from the pixel-defining layer 213 because of the condensation reaction in the high-temperature and high-humidity environment. Because of the gases generated due to the condensation reaction of organic materials included in organic material layers disposed on the substrate 100, at least a portion of the opposite electrode 230 disposed on the emission layer 222 may be oxidized. As at least a portion of the opposite electrode 230 is oxidized, a substantial area of the opposite electrode 230 may decrease. To maintain the same brightness despite the reduction in the substantial area of the opposite electrode 230, a current applied to the emission layer 222 may increase. Because of the increasing current, the emission layer 222 may deteriorate, and the substantial area of the emission layer 222 may be reduced. Areas of the first to third emission areas EA1 to EA3 may decrease because of the decrease in the substantial area of the emission layer 222.

Before the areas of the first to third emission areas EA1 to EA3 decrease, the first to third emission areas EA1 to EA3 may be defined as the openings 213OP of the pixel-defining layer 213. In other words, before the areas of the first to third emission areas EA1 to EA3 decrease, the area of the first emission area EA1 may be the same as a size of the first opening 213OP1 of the pixel-defining layer 213, and the area of the second emission area EA2 may be the same as a size of the second opening 213OP2 of the pixel-defining layer 213. Also, the area of the third emission area EA3 may be the same as a size of the third opening 213OP3 of the pixel-defining layer 213. After the areas of the first to third emission areas EA1 to EA3 decrease, the first emission area EA1 may be located in the first opening 213OP1 of the pixel-defining layer 213, and the second emission area EA2 may be located in the second opening 213OP2 of the pixel-defining layer 213. Also, the third emission area EA3 may be located in the third opening 213OP3 of the pixel-defining layer 213.

Before the areas of the first to third emission areas EA1 to EA3 decrease, the areas of the first to third emission areas EA1 to EA3 may be different from each other. The first emission area EA1 may be an area where the green light is emitted and have the smallest area. The third emission area EA3 may be an area where the blue light is emitted and have the greatest area. The second emission area EA2 may be an area where the red light is emitted and have an area that is intermediate between the area of the first emission area EA1 and the area of the third emission area EA3.

In an embodiment, depending on the areas of the first to third emission areas EA1 to EA3, the amount of light emitted may change. In other words, the amount of green light emitted in the first emission area EA1 may be the least, and the amount of blue light emitted in the third emission area EA3 may be the greatest. The amount of red light emitted in the second emission area EA2 may be intermediate between the amount of light emitted in the first emission area EA1 and the amount of light emitted in the third emission area EA3. Because the amount of light changes according to colors (that is, wavelengths) of light emitted in the first to third emission areas EA1 to EA3, white light may be realized.

As described above, the areas of the first to third emission areas EA1 to EA3 may decrease because of the gases generated due to the condensation reaction of the organic materials included in the organic material layers disposed on the substrate 100. The amount of gases respectively generated around the first emission area EA1, the second emission area EA2, and the third emission area EA3 may be the same, and the oxidized area of the opposite electrode 230 may be the same accordingly. As a result, the areas of the first emission area EA1, the second emission area EA2, and the third emission area EA3 which decrease may be the same as each other. The areas of the first emission area EA1, the second emission area EA2, and the third emission area EA3 may be different from each other before gases are generated and the opposite electrode 230 is oxidized, and because the reduced areas of the first emission area EA1, the second emission area EA2, and the third emission area EA3 are the same, the first emission area EA1 may be reduced in a relatively greater ratio than the second emission area EA2 and the third emission area EA3. In other words, ratios of the first emission area EA1, the second emission area EA2, and the third emission area EA3 may be different before and after the areas of the first emission area EA1, the second emission area EA2, and the third emission area EA3 are reduced. Because the ratios of the amount of light emitted in the first emission area EA1 to the third emission area EA3 are different from those before the areas of the first to third emission areas EA1 to EA3 are reduced, it may be impossible to realize white light. To realize the white light, the ratios of the first emission area EA1, the second emission area EA2, and the third emission area EA3 may be the same before and after the areas of the first emission area EA1, the second emission area EA2, and the third emission area EA3 are reduced. To make the ratios of the first emission area EA1, the second emission area EA2, and the third emission area EA3 be the same before and after the areas of the first emission area EA1, the second emission area EA2, and the third emission area EA3 are reduced, the reduced areas of the first emission area EA1, the second emission area EA2, and the third emission area EA3 may be different from each other.

To decrease the areas of the first emission area EA1, the second emission area EA2, and the third emission area EA3 while maintaining the same ratio, the reduced area of the first emission area EA1 may be the smallest. Also, the reduced area of the third emission area EA3 may be the greatest. The reduced area of the second emission area EA2 may be intermediate between the reduced area of the first emission area EA1 and the reduced area of the third emission area EA3.

After the first to third emission areas EA1 to EA3 are reduced, a distance L1 exists between an edge of the first emission area EA1 extending in a first direction, e.g., an x direction, and an edge of the first opening 213OP1 of the pixel-defining layer 213 extending in the first direction, e.g., the x direction. The distance L1 is measured in a second direction, e.g., a y direction, crossing the first direction, e.g., the x direction. A distance L2 exists between an edge of the second emission area EA2 extending in the first direction, e.g., the x direction, and an edge of the second opening 213OP2 of the pixel-defining layer 213 extending in the first direction, e.g., the x direction. The distance L2 is measured in a second direction, e.g., a y direction, crossing the first direction, e.g., the x direction. A distance L3 exists between an edge of the third emission area EA3 extending in the first direction, e.g., the x direction, and an edge of the third opening 213OP3 of the pixel-defining layer 213 extending in the first direction, e.g., the x direction. The distance L3 is measured in a second direction, e.g., a y direction, crossing the first direction, e.g., the x direction. The distances L1, L2, and L3 in the second direction, e.g., the y direction, from the edges of the first to third emission areas EA1 to EA3 extending in the first direction, e.g., the x direction, respectively from the first to third openings 213OP1 to 213OP3 may be the same. When the distances in the second direction, e.g., the y direction, from the edges of the first to third emission areas EA1 to EA3 extending in the first direction, e.g., the x direction, to the edges of the first to third openings 213OP1 to 213OP3 extending in the first direction, e.g., the x direction, are the same as each other, the ratios of the reduced areas of the first to third emission areas EA1 to EA3 may be the same as the ratios of the areas of the first to third emission areas EA1 to EA3 before the areas of the first to third emission areas EA1 to EA3 are reduced.

The reduced areas of the first to third emission areas EA1 to EA3 may be proportional to influences of the gases generated due to the condensation reaction of the organic materials on the first to third emission areas EA1 to EA3. The influences of the gases on the first to third emission areas EA1 to EA3 may be adjusted by out-gassing holes H around the first to third emission areas EA1 to EA3. The influence of the gas generated around the first emission area EA1 on the first emission area EA1 may be the least, and the influence of the gas generated around the third emission area EA3 on the third emission area EA3 may be the greatest. The influence of the gas generated around the second emission area EA2 on the second emission area EA2 may be intermediate between the influences of the gases generated around the first emission area EA1 and the third emission area EA3.

The out-gassing holes H may be arranged around the first to third emission areas EA1 to EA3. The out-gassing holes H may include a first out-gassing hole H1, a second out-gassing hole H2, and a third out-gassing hole H3. The first out-gassing hole H1 may be defined around the first emission area EA1 or the first opening 213OP1 of the pixel-defining layer 213. The second out-gassing hole H2 may be defined around the second emission area EA2 or the second opening 213OP2 of the pixel-defining layer 213. Also, the third out-gassing hole H3 may be defined around the third emission area EA3 or the third opening 213OP3 of the pixel-defining layer 213.

The influences of the gases generated around the first to third emission areas EA1 to EA3 respectively on the first to third emission areas EA1 to EA3 may differ according to areas of the out-gassing holes H around the first to third emission areas EA1 to EA3 or distances between the out-gassing holes H and the first to third emission areas EA1 to EA3. To make the gas generated around the first emission area EA1 have the smallest influence on the first emission area EA1, the area of the first out-gassing hole H1 may be the greatest. Also, the distance between the first out-gassing hole H1 and the first emission area EA1 may be the shortest. To make the gas generated around the third emission area EA3 have the greatest influence on the third emission area EA3, the area of the third out-gassing hole H3 may be the smallest. Also, the distance between the third out-gassing hole H3 and the third emission area EA3 may be the shortest. The area of the second out-gassing hole H2 may be intermediate between the area of the first out-gassing hole H1 and the area of the third out-gassing hole H3. Also, the distance between the second out-gassing hole H2 and the second emission area EA2 may be intermediate between the distance between the first out-gassing hole H1 and the first emission area EA1 and the distance between the third out-gassing hole H3 and the third emission area EA3.

Referring to FIG. 4A, the first out-gassing hole H1, the second out-gassing hole H2, and the third out-gassing hole H3 may be defined around the first opening 213OP1, the second opening 213OP2, and the third opening 213OP3 of the pixel-defining layer 213, respectively. Each of the first out-gassing hole H1, the second out-gassing hole H2, and the third out-gassing hole H3 may include four holes. However, an area of the first out-gassing hole H1 may be the greatest, and an area of the third out-gassing hole H3 may be the smallest. An area of the second out-gassing hole H2 may be intermediate between the areas of the first out-gassing hole H1 and the third out-gassing hole H3. Therefore, the area of the first out-gassing hole H1 may be the greatest, and the area of the third out-gassing hole H3 may be the smallest. Also, the area of the second out-gassing hole H2 may be intermediate between the areas of the first out-gassing hole H1 and the third out-gassing hole H3.

Referring to FIG. 4B, the areas of the first to third out-gassing holes H1 to H3 may be the same as each other. The first out-gassing hole H1 may include four holes, and the second out-gassing hole H2 may include three holes. Also, the third out-gassing hole H3 may include two holes. Therefore, the area of the first out-gassing hole H1 may be the greatest, and the area of the third out-gassing hole H3 may be the smallest. Also, the area of the second out-gassing hole H2 may be intermediate between the areas of the first out-gassing hole H1 and the third out-gassing hole H3.

Referring to FIG. 4C, the shortest distance t1 may exist between the first out-gassing hole H1 and the edge of the first opening 213OP1 of the pixel-defining layer 213. The shortest distance t2 may exist between the second out-gassing hole H2 and the edge of the second opening 213OP2 of the pixel-defining layer 213. Also, the shortest distance t3 may exist between the third out-gassing hole H3 and the edge of the third opening 213OP3 of the pixel-defining layer 213. The shortest distance t1 between the first out-gassing hole H1 and the edge of the first opening 213OP1 of the pixel-defining layer 213 may be the shortest, and the shortest distance t3 between the third out-gassing hole H3 and the edge of the third opening 213OP3 of the pixel-defining layer 213 may be the greatest. The shortest distance t2 between the second out-gassing hole H2 and the edge of the second opening 213OP2 of the pixel-defining layer 213 may be intermediate between the shortest distance t1 between the first out-gassing hole H1 and the edge of the first opening 213OP1 of the pixel-defining layer 213 and the shortest distance t3 between the third out-gassing hole H3 and the edge of the third opening 213OP3 of the pixel-defining layer 213.

FIG. 5 shows the first emission area EA1 and the first out-gassing hole H1 of the display panel 10. The area of the first emission area EA1 may be smaller than that of the first emission layer 222a. As described above, at least a portion of the opposite electrode 230 may be oxidized in the high temperature and high-humidity environment, and as the first emission layer 222a deteriorates because of the current increase, the substantial area of the first emission layer 222a (in other words, the first emission area EA1) may decrease. Because of the reduction in the substantial area of the first emission layer 222a, the first emission area EA1 may be located in the first opening 213OP1 of the pixel-defining layer 213.

In an embodiment the first out-gassing hole H1 may be defined around the first emission area EA1. The first out-gassing hole H1 may be formed by patterning the pixel-defining layer 213. In other words, the first out-gassing hole H1 may be defined in the pixel-defining layer 213. The opposite electrode 230, the thin-film encapsulation layer 300, etc. may be on the first out-gassing hole H1.

FIGS. 6 to 14 are schematic diagrams of a method of manufacturing a display panel 10, according to an embodiment.

Referring to FIGS. 2A, 2B, and 4A to 14, a method of manufacturing the display panel 10 includes arranging the substrate 100 including the first emission area EA1, the second emission area EA2, and the third emission area EA3. The organic insulating layers 209 and 211 are formed on the substrate 100. The first pixel electrode 221a, the second pixel electrode 221b, and the third pixel electrode 221c are formed on the organic insulating layers 209 and 211. The first protective layer 400a, the second protective layer 400b, and the third protective layer 400c respectively are arranged on the first pixel electrode 221a, the second pixel electrode 221b, and the third pixel electrode 221c. A material 212 for forming a pixel-defining layer is formed on the first protective layer 400a, the second protective layer 400b, and the third protective layer 400c. The pixel-defining layer 213, in which the out-gassing holes H, the first opening 213OP1, the second opening 213OP2, and the third opening 213OP3 are defined is formed, by patterning the material 212 for forming the pixel-defining layer. At least a portion of each of the first protective layer 400a, the second protective layer 400b, and the third protective layer 400c is exposed by each of the first opening 213OP1, the second opening 213OP2, and the third opening 213OP3. The first protective layer 400a, the second protective layer 400b, and the third protective layer 400c, which are exposed respectively by the first opening 213OP1, the second opening 213OP2, and the third opening 213OP3 are removed. The first emission layer 222a, the second emission layer 222b, and the third emission layer 222c are formed on the first pixel electrode 221a, the second pixel electrode 221b, and the third pixel electrode 221c.

Figure 6:
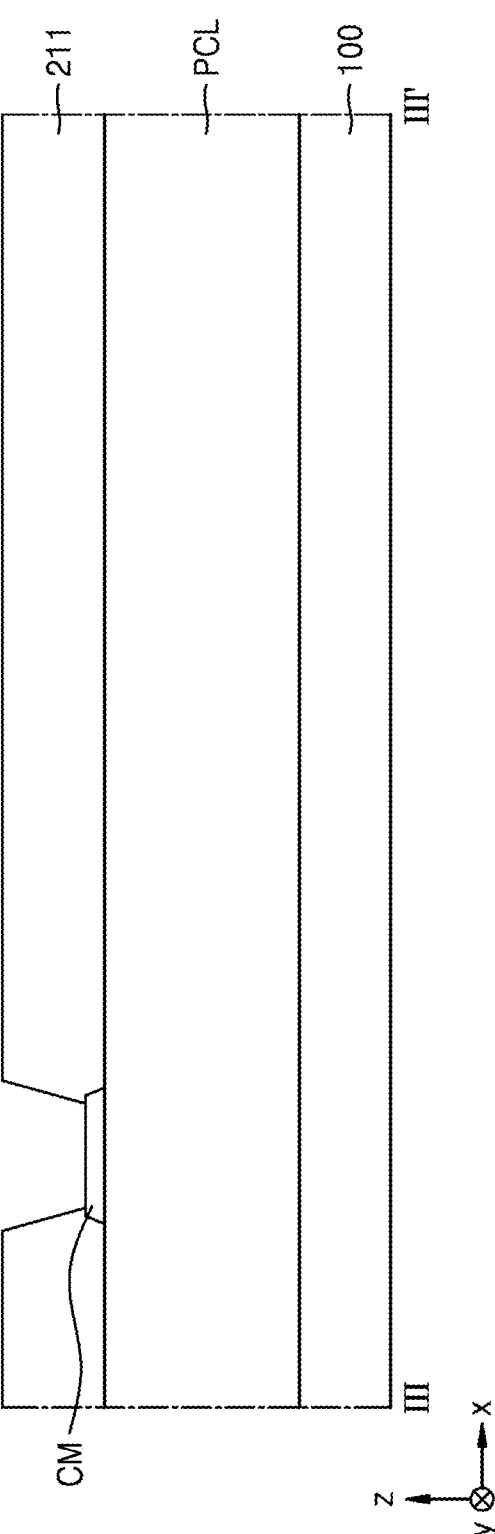
FIGS. 6, 7, 8, 9, 10, 11, 12, 13, and 14 are schematic diagrams of a method of manufacturing a display panel, according to an embodiment.

Referring to FIG. 6, the pixel circuit layer PCL may be disposed on the substrate 100. The pixel circuit layer PCL may include the inorganic insulating layers 201, 203, 205, and 207, the thin-film transistor TFT, the storage capacitor Cst, and the first organic insulating layer 209. The second organic insulating layer 211 and the connection electrode CM may be disposed on the pixel circuit layer PCL. An opening may be defined in the second organic insulating layer 211. At least a portion of the connection electrode CM may be exposed by the opening of the second organic insulating layer 211.

Figure 7:
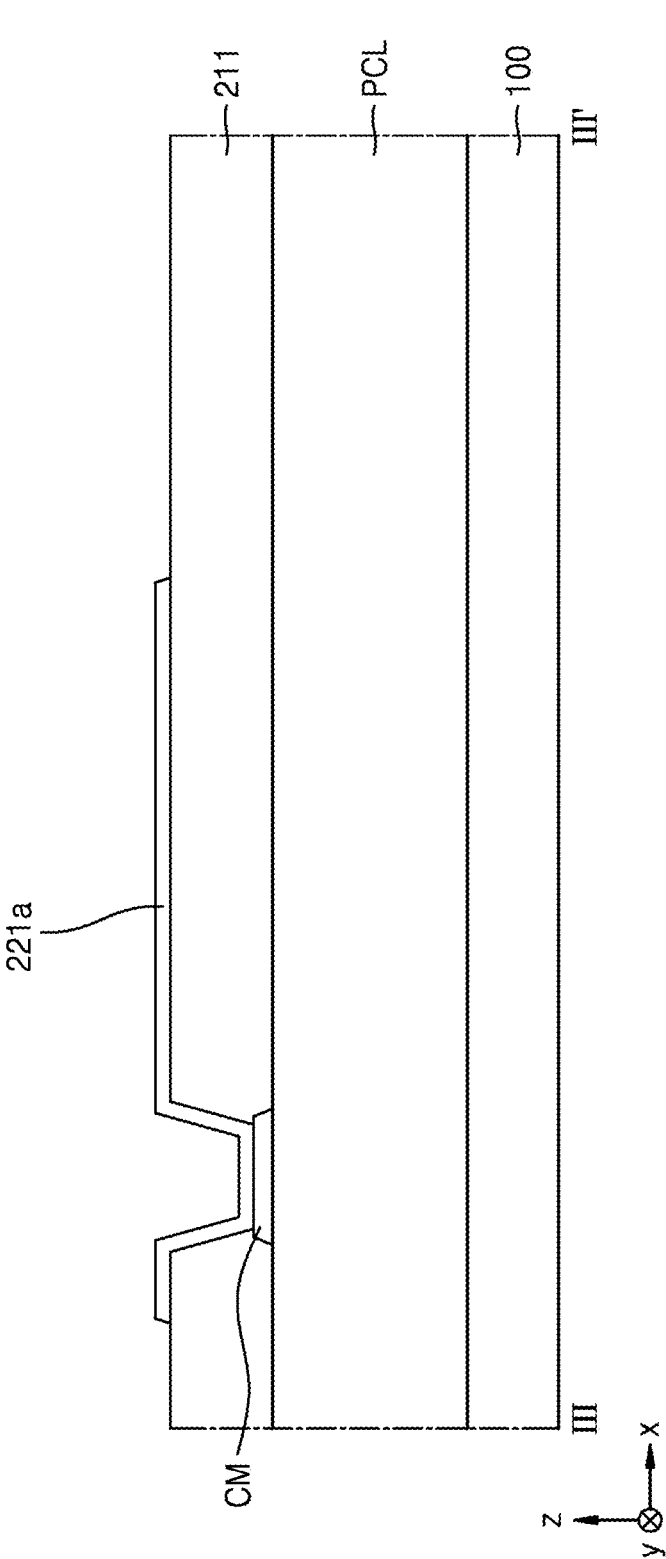

Referring to FIG. 7, the first pixel electrode 221a may be disposed on the connection electrode CM. The first pixel electrode 221a may be continuously along the connection electrode CM, the inner side surfaces of the second organic insulating layer 211, which form the opening of the second organic insulating layer 211, and at least a portion of the second organic insulating layer 211.

Figure 8:
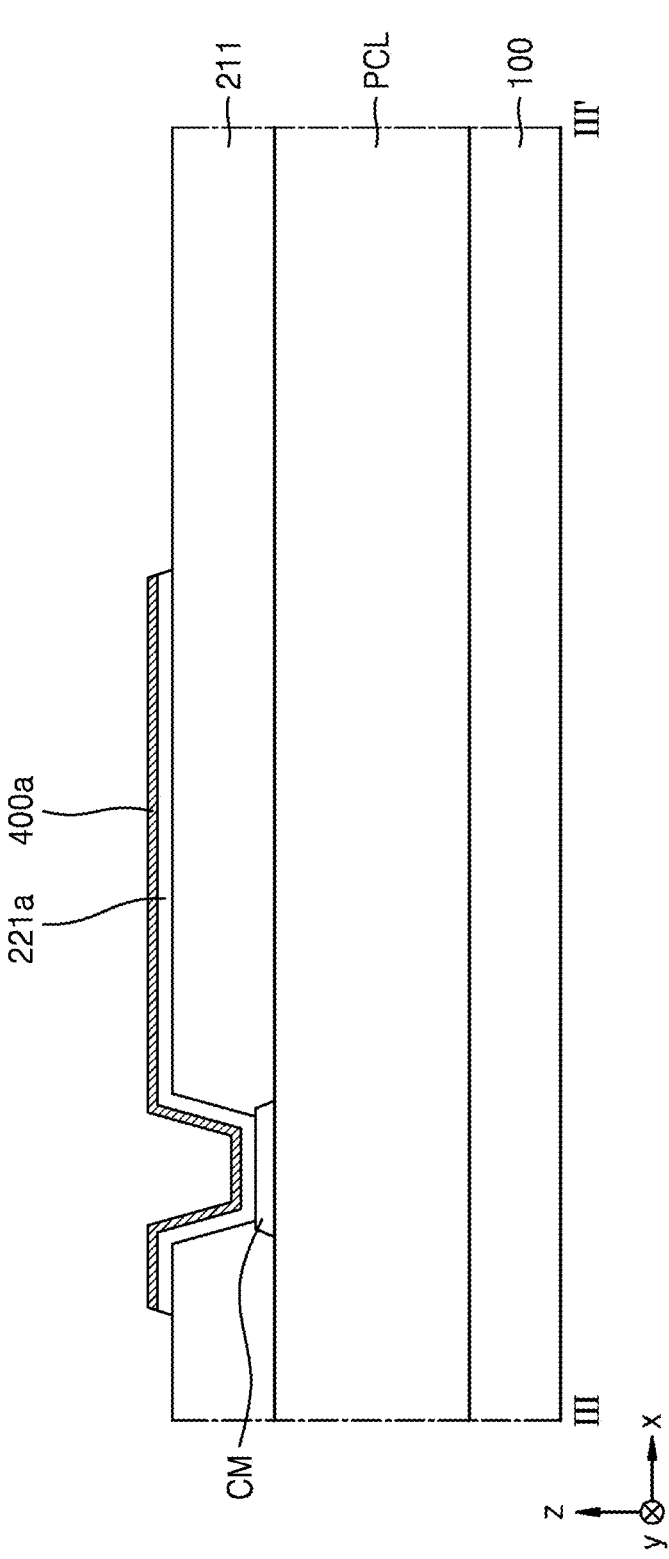

Referring to FIG. 8, the first protective layer 400a may be disposed on the first pixel electrode 221a. The first protective layer 400a may protect the first pixel electrode 221a during the process of patterning the pixel-defining layer 213, which is described below in detail.

Figure 9:
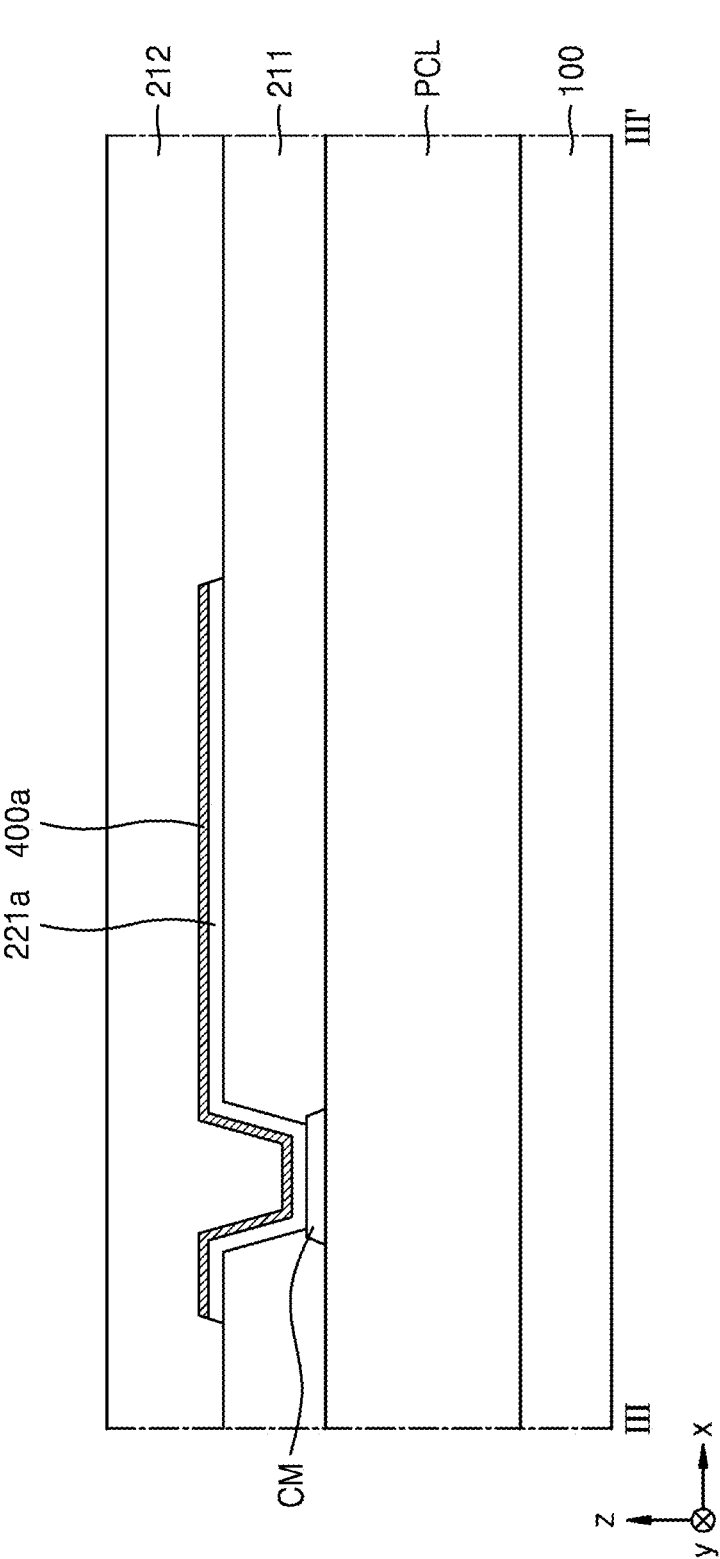
Figure 10:
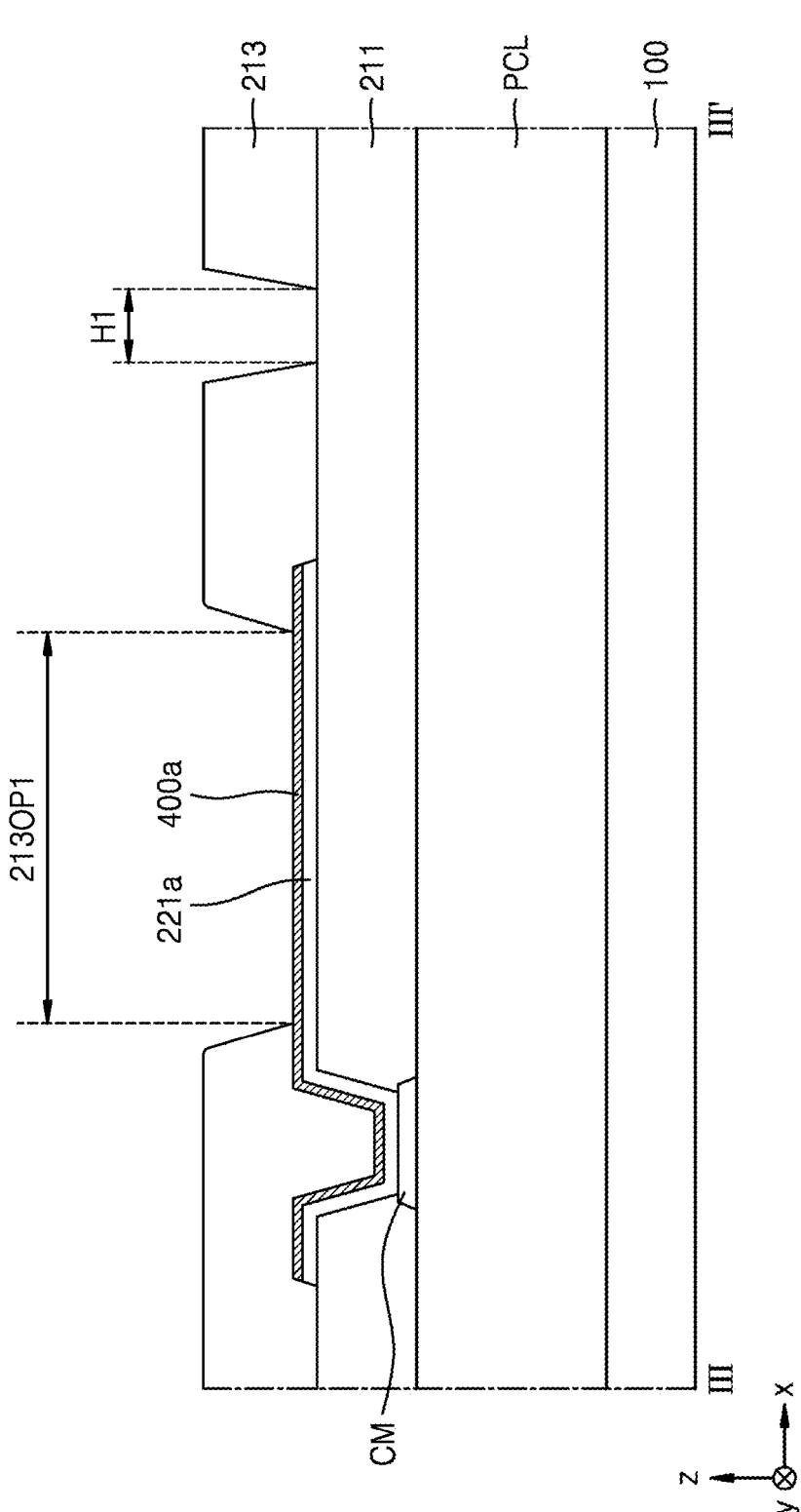
Figure 11:
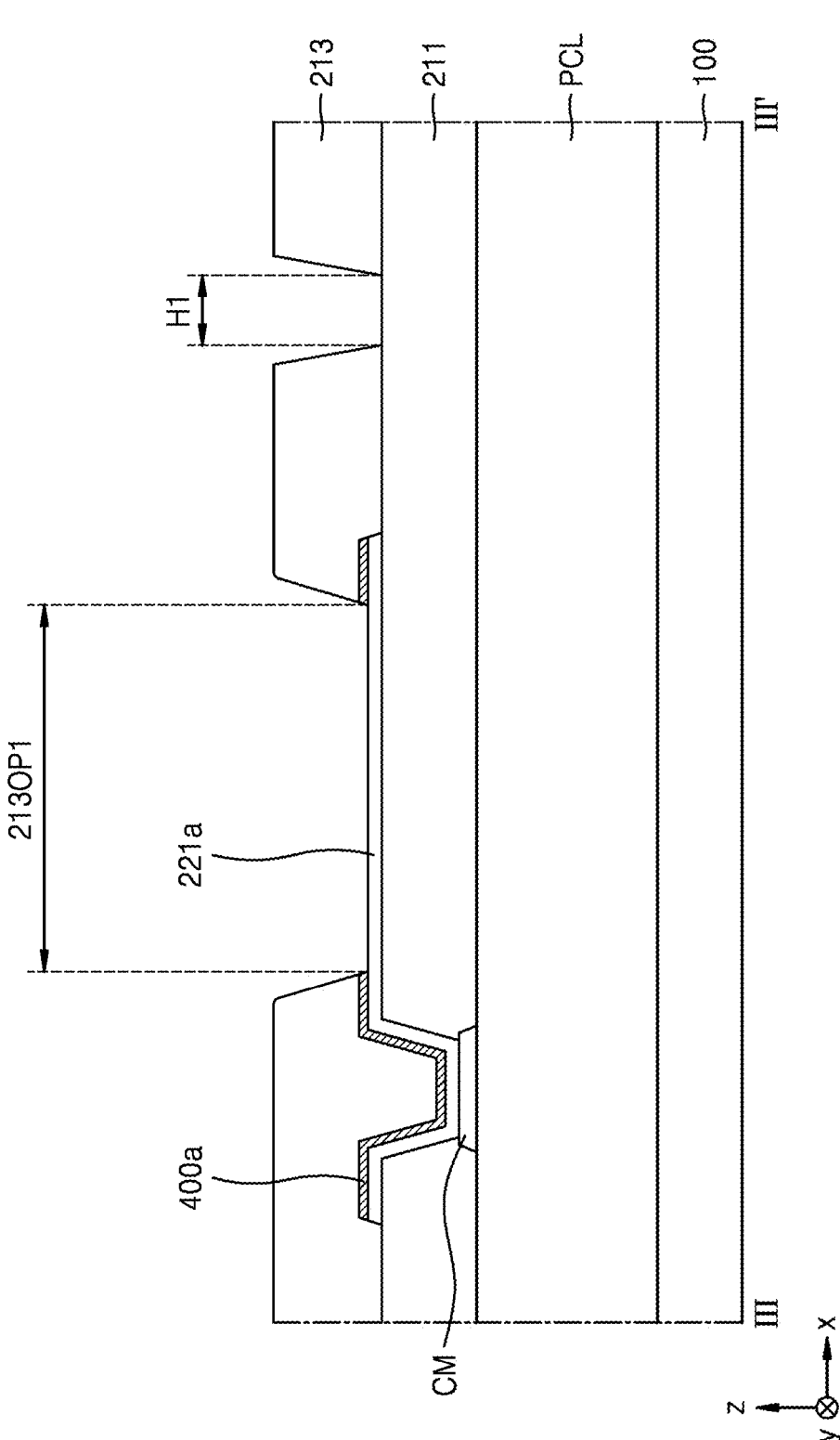

Referring to FIGS. 9 to 11, the material 212 for forming the pixel-defining layer may cover the first protective layer 400a. The material 212 for forming the pixel-defining layer may continuously cover the first protective layer 400a and the second organic insulating layer 211.

The pixel-defining layer 213 may be formed by patterning the material 212 for forming the pixel-defining layer. The first opening 213OP1 and the first out-gassing hole H1 may be defined in the pixel-defining layer 213. The first opening 213OP1 of the pixel-defining layer 213 and the first out-gassing hole H1 may be defined through the patterning process.

Although not shown, during the process of patterning the pixel-defining layer 213, photoresist may cover the material 212 for forming the pixel-defining layer. The photoresist covering portions, in which the first opening 213OP1 of the pixel-defining layer 213 and the first out-gassing hole H1 are to be formed, may be removed through a process. The material 212 for forming the pixel-defining layer in portions that are not covered by the photoresist may be removed through dry etching. In this case, to protect the first pixel electrode 221a from the plasma, the first protective layer 400a may be disposed on the first pixel electrode 221a. Through dry etching, the first opening 213OP1 and the first out-gassing hole H1 may be formed in the pixel-defining layer 213. The photoresist remaining on at least a portion of the pixel-defining layer 213 may be removed.

The first protective layer 400a exposed by the first opening 213OP1 of the pixel-defining layer 213 may be removed. The first protective layer 400a exposed by the first opening 213OP1 of the pixel-defining layer 213 may be removed through wet etching. The first protective layer 400a on the first pixel electrode 221a, except for the exposed portion of the first protective layer 300a, may remain. In other words, the first protective layer 400a may be between the pixel-defining layer 213 and the first pixel electrode 221a.

Figure 12:
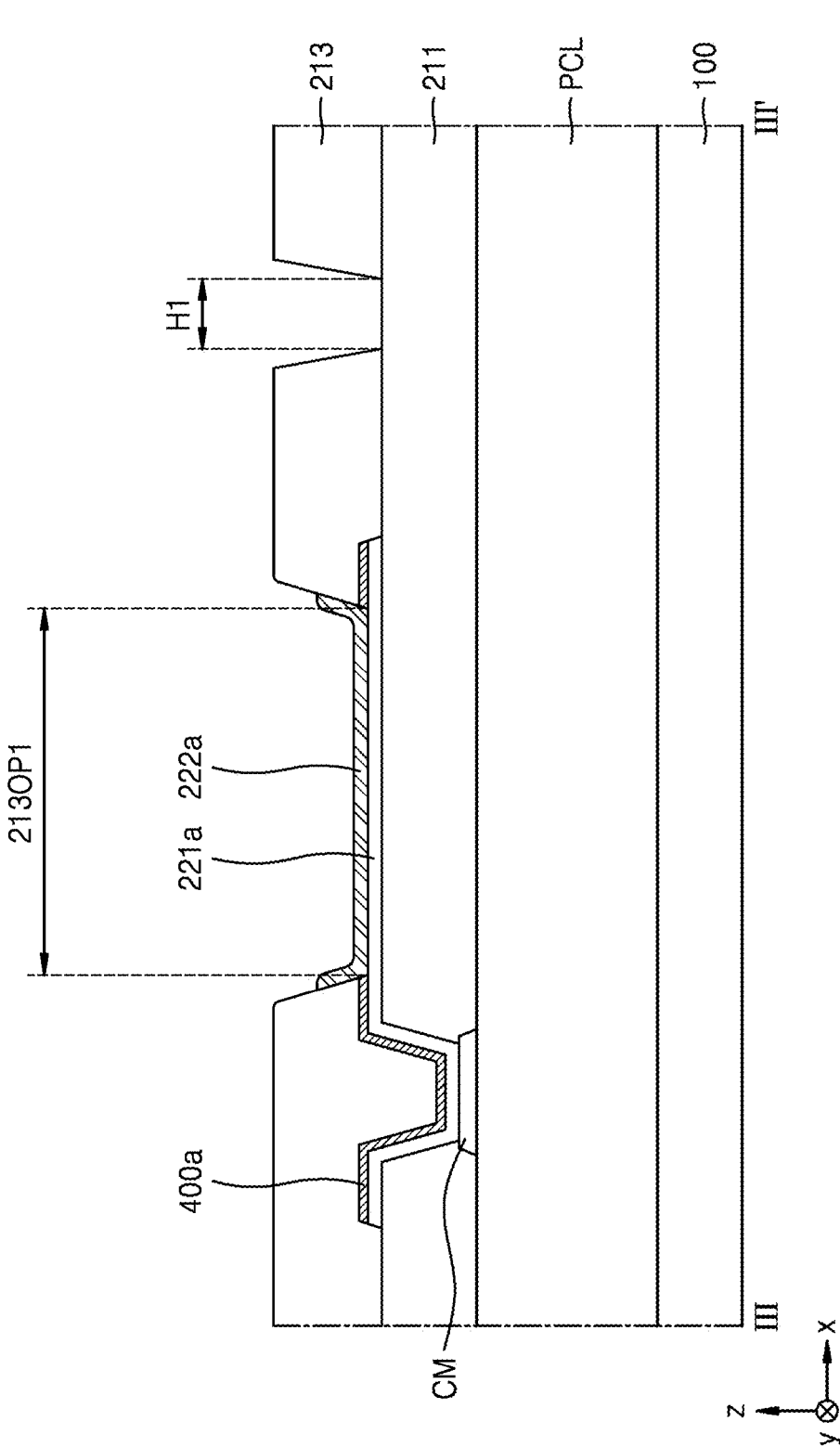
Figure 13:
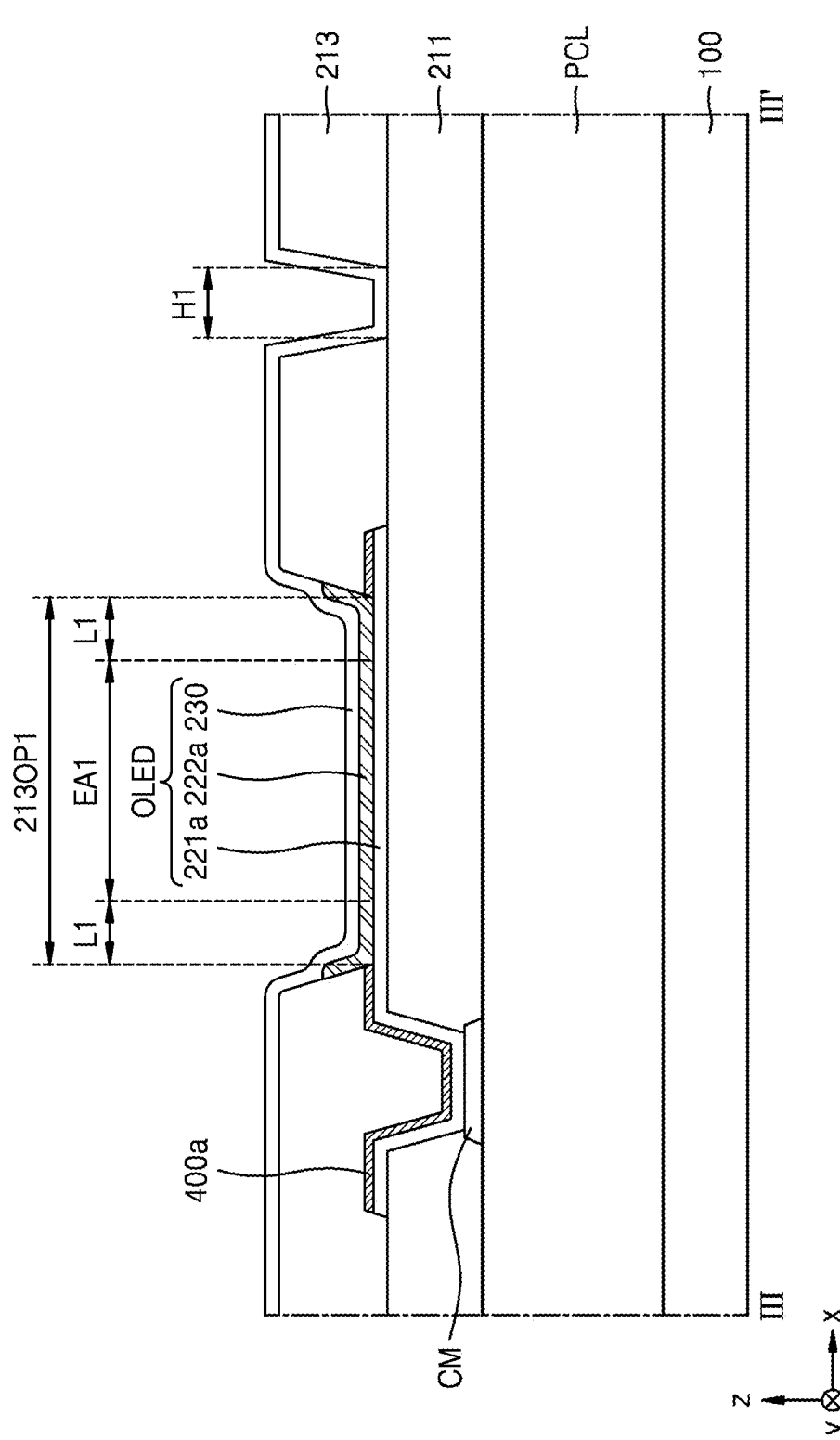
Figure 14:
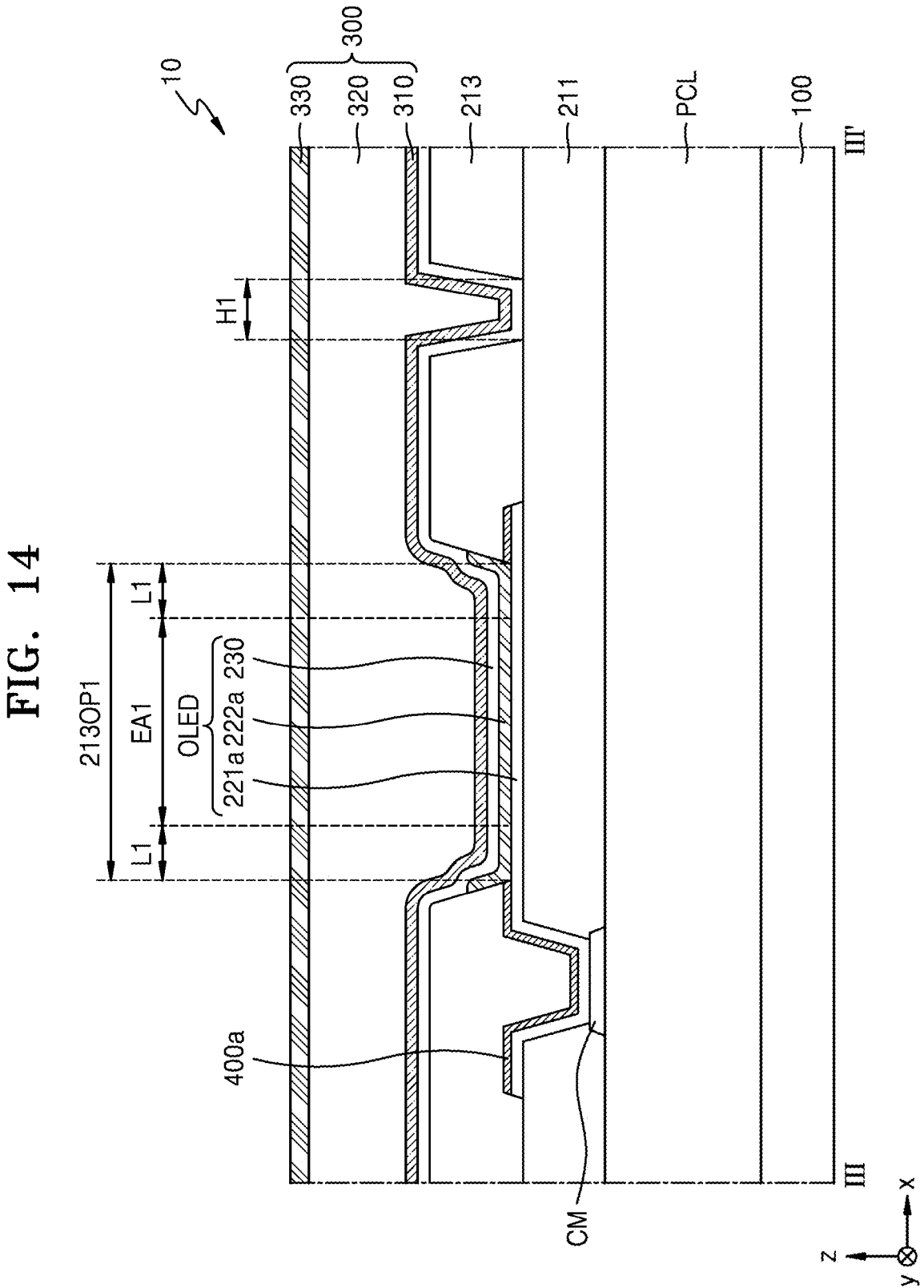

Referring to FIGS. 12 to 14, the first emission layer 222a may be disposed on the first pixel electrode 221a. The opposite electrode 230 may be disposed on the first emission layer 222a. Because the first pixel electrode 221a, the first emission layer 222a, and the opposite electrode 230 are located in the first opening 213OP1 of the pixel-defining layer 213, the first opening 213OP1 of the pixel-defining layer 213 may correspond to the first emission area EA1. However, when the display panel 10 is exposed to the high-temperature and high-humidity environment, the substantial area of the first emission layer 222a decreases because of the deterioration in the first emission layer 222a, and thus, at least a portion of the first opening 213OP1 of the pixel-defining layer 213 may only be the first emission area EA1.

The thin-film encapsulation layer 300 may be disposed on the opposite electrode 230. The thin-film encapsulation layer 300 may include the first inorganic encapsulation layer 310, the second inorganic encapsulation layer 330, and the organic encapsulation layer 320 between the first inorganic encapsulation layer 310 and the second inorganic encapsulation layer 330. The thin-film encapsulation layer 300 may continuously cover the opposite electrode 230.

Figure 15A:
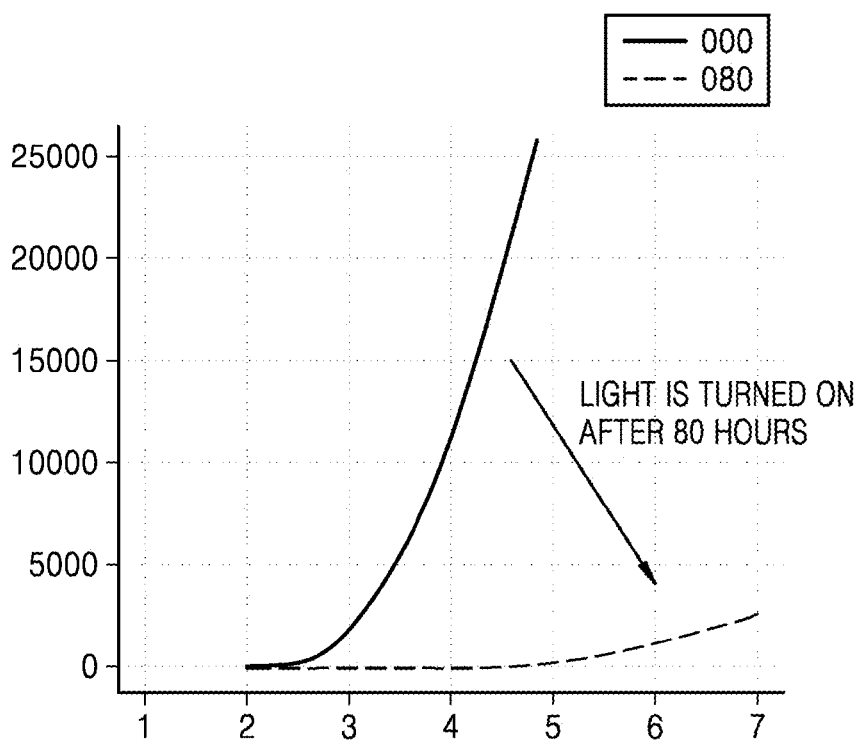
FIGS. 15A and 15B are schematic luminous area-voltage graphs.
Figure 15B:
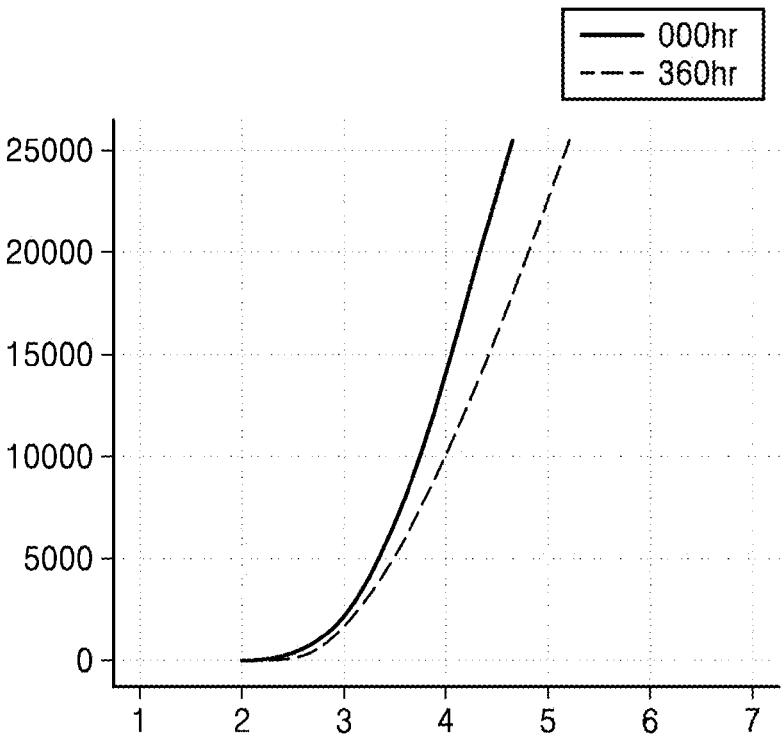

FIGS. 15A and 15B are schematic luminous area-voltage graphs. FIGS. 15A and 15B schematically show a luminous area-voltage graph when the pixel-defining layer 213 includes an organic material and a luminous area-voltage graph when the pixel-defining layer 213, e.g., see FIG. 5, includes an inorganic material.

Referring to FIG. 15A, when the pixel-defining layer 213 includes an organic material, and when a voltage of about 5 V is applied to the display panel 10, the brightness of the display panel 10 may be about 25000 cd/m². However, when the display panel 10 is exposed to a high-temperature environment for about 80 hours, and when the voltage of about 5 V is applied to the display panel 10, the display panel 10 may rarely emit light. When the pixel-defining layer 213 of the display panel 10 includes an organic material, and when the display panel 10 is exposed to a high-temperature and high-humidity environment, the area of the emission area may greatly decrease.

Referring to FIG. 15B, when the pixel-defining layer 213 includes an inorganic material, and when a voltage of about 4 V is applied to the display panel, the brightness of the display panel 10 may be about 15000 cd/m². However, when the display panel 10 is exposed to the high-temperature environment for about 360 hours, and when the voltage of about 4 V is applied to the display panel 10, the brightness of the display panel 10 may be about 10000 cd/m². When the pixel-defining layer 213 of the display panel 10 includes an inorganic material, although the display panel is exposed to the high-temperature environment for about four times more than the time set in FIG. 15A, the areas of the first to third emission areas EA1 to EA3 may not greatly decrease.

The pixel-defining layer of the display panel 10 may include the inorganic material. The pixel-defining layer 213 may be a layer or layers including SiOx, SiNx, and/or SiON.

Figure 16:
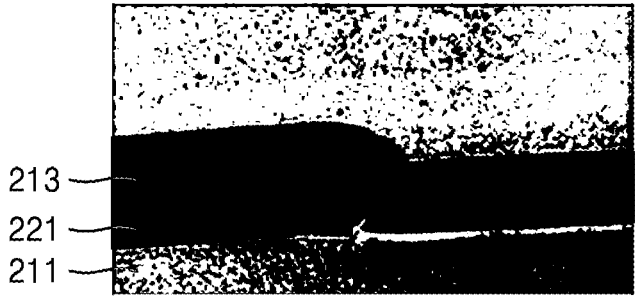
FIG. 16 schematically shows a cross-section of a display panel, according to an embodiment.

FIG. 16 schematically shows a cross-section of a display panel, according to an embodiment.

Referring to FIG. 16, when the pixel-defining layer 213 includes an inorganic material, gases, which are generated because of a condensation reaction of the second organic insulating layer 211 disposed under the pixel-defining layer 213 in the high-temperature and high-humidity environment, may not be emitted. When the gases generated from the second organic insulating layer 211 may not be emitted because of the pixel-defining layer 213 including the inorganic material, film floatation may occur between the second organic insulating layer 211 and the pixel-defining layer 213.

As the out-gassing holes H, e.g., see FIG. 4A, are defined in the pixel-defining layer 213, the gases generated because of the condensation reaction of the second organic insulating layer 211 may be emitted. The film floatation between the second organic insulating layer 211 and the pixel-defining layer 213 may decrease because of the out-gassing holes H defined in the pixel-defining layer 213, and adhesion between the second organic insulating layer 211 and the pixel-defining layer 213 may be improved.

When a display panel is exposed to a high-temperature and high-humidity environment, gases may be generated because of a condensation reaction of an organic material included in an organic insulating layer disposed on a substrate. At least a portion of an opposite electrode may be oxidized because of the gases generated in an organic material layer. To maintain the same brightness, a current applied to an emission layer may increase. The emission layer may deteriorate because of a current increase, and an area of a pixel (or an emission area) may decrease.

Because ratios, at which a first emission area of a first pixel, a second emission area of a second pixel, and a third emission area of a third pixel respectively decrease because of the deterioration of the emission layer, may differ, white light may not be realized, and the visibility of the reduced emission areas may increase. When the ratios, at which the first emission area of the first pixel, the second emission area of the second pixel, and the third emission area of the third pixel respectively decrease, are the same, the white light may be realized, and the visibility of the reduced emission areas may decrease.

A first out-gassing hole, a second out-gassing hole, and a third out-gassing hole may be defined around the first emission area, the second emission area, and the third emission area, respectively, and as areas of out-gassing holes or distances from the out-gassing holes to emission areas are different from each other, the ratios at which the first emission area of the first pixel, the second emission area of the second pixel, and the third emission area of the third pixel respectively decrease may be the same as each other.

Also, when the pixel-defining layer includes an inorganic material, the amount of gases generated because of a condensation reaction of organic materials is reduced compared to when the pixel-defining layer includes an organic material, and the reduction in the areas of the emission areas may be prevented. However, when the pixel-defining layer includes an inorganic material, film floatation may occur between the pixel-defining layer and a second organic insulating layer disposed thereunder, and when the out-gassing holes are defined in the pixel-defining layer, the gases may be discharged, and thus, the adhesion between the pixel-defining layer and the second organic insulating layer disposed thereunder may be improved.

According to the one or more embodiments, a display panel having improved visibility and a method of manufacturing the display panel may be realized. However, the scope of the disclosure is not limited by the effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
a substrate comprising a first emission area, a second emission area, and a third emission area;
an organic insulating layer on the substrate;
a first pixel electrode, a second pixel electrode, and a third pixel electrode on the organic insulating layer;
a pixel-defining layer in which a first opening, a second opening, a third opening, and an out-gassing hole are defined, wherein each of the first opening, the second opening, and the third opening extends to at least a portion of each of the first pixel electrode, the second pixel electrode, and the third pixel electrode; and
a first emission layer, a second emission layer, and a third emission layer respectively on the first pixel electrode, the second pixel electrode, and the third pixel electrode,
wherein the out-gassing hole comprises a first out-gassing hole defined around the first opening, a second out-gassing hole defined around the second opening, and a third out-gassing hole defined around the third opening, and
an area of the first out-gassing hole is greater than an area of the second out-gassing hole and the area of the first out-gassing hole is greater than an area of the third out-gassing hole.

2. The display panel of claim 1, wherein the area of the second out-gassing hole is greater than the area of the third out-gassing hole.

3. The display panel of claim 1, wherein the first emission area is a light-emitting area of the first emission layer, the second emission area is a light-emitting area of the second emission layer, and the third emission area is a light-emitting area of the third emission layer.

4. The display panel of claim 1, wherein the area of the first emission area is less than the area of the second emission area, and the area of the second emission area is less than the area of the third emission area.

5. The display panel of claim 3, wherein distances between edges of the first opening, the second opening, and the third opening extending in a first direction to edges of the first emission area, the second emission area, and the third emission area extending in the first direction are a same as each other, the distances being measured in a second direction crossing the first direction.

6. The display panel of claim 1, wherein green light, red light, and blue light are emitted from the first emission area, the second emission area, and the third emission area, respectively.

7. The display panel of claim 1, further comprising a first protective layer, a second protective layer, and a third protective layer respectively on the first pixel electrode, the second pixel electrode, and the third pixel electrode, except for portions of the first pixel electrode, the second pixel electrode, and the third pixel electrode to which the first opening, the second opening, and the third opening of the pixel-defining layer extend.

8. The display panel of claim 1, wherein the pixel-defining layer comprises an inorganic material.

9. The display panel of claim 1, further comprising an opposite electrode on the first emission layer, the second emission layer, and the third emission layer.

* * * * *